United States Patent
Yamae et al.

(10) Patent No.: US 9,786,859 B2
(45) Date of Patent: Oct. 10, 2017

(54) ORGANIC ELECTROLUMINESCENT ELEMENT AND LIGHTING DEVICE

(71) Applicant: PANASONIC INTELLECTUAL PROPERTY MANAGEMENT CO., LTD., Osaka (JP)

(72) Inventors: Kazuyuki Yamae, Nara (JP); Hiroya Tsuji, Kyoto (JP); Varutt Kittichungchit, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/787,337

(22) PCT Filed: May 13, 2014

(86) PCT No.: PCT/JP2014/002527
§ 371 (c)(1),
(2) Date: Oct. 27, 2015

(87) PCT Pub. No.: WO2014/185063
PCT Pub. Date: Nov. 20, 2014

(65) Prior Publication Data
US 2016/0064682 A1 Mar. 3, 2016

(30) Foreign Application Priority Data
May 17, 2013 (JP) .................................. 2013-105220

(51) Int. Cl.
*H01L 29/08* (2006.01)
*H01L 51/50* (2006.01)
(Continued)

(52) U.S. Cl.
CPC ............ *H01L 51/504* (2013.01); *C09K 11/06* (2013.01); *H01L 27/3209* (2013.01);
(Continued)

(58) Field of Classification Search
CPC ............... H01L 51/504; H01L 51/5044; H01L 51/5012; H01L 51/5016; H01L 51/5206;
(Continued)

(56) References Cited

U.S. PATENT DOCUMENTS 7,525,129 B2    4/2009  Masuda et al.
8,669,129 B2 *  3/2014  Miki ................... C23C 14/0617
                                                           257/103
(Continued)

FOREIGN PATENT DOCUMENTS

JP    2008-518400    5/2008
JP    2009-224274    10/2009
(Continued)

OTHER PUBLICATIONS

Office Action issued in Germany Counterpart Patent Appl. No. 112014002456.2, dated Oct. 6, 2016, along with an English translation thereof.

*Primary Examiner* — Hung Vu
(74) *Attorney, Agent, or Firm* — Greenblum & Bernstein, P.L.C.

(57) ABSTRACT

An organic electroluminescent element including at least three light-emitting units. The at least three light-emitting units include one or more short-wavelength light-emitting units having a weighted average emission wavelength $\lambda_S$ of 380 or more and less than 550 nm, and two or more long-wavelength light-emitting units having a weighted average emission wavelength $\lambda_S$ of 550 nm or more and 780 nm or less. The two or more long-wavelength light-emitting units are greater in number than the one or more short-wavelength light-emitting units.

10 Claims, 10 Drawing Sheets

(51) Int. Cl.
*H01L 51/52* (2006.01)
*C09K 11/06* (2006.01)
*H01L 27/32* (2006.01)

(52) U.S. Cl.
CPC ...... *H01L 51/5012* (2013.01); *H01L 51/5016* (2013.01); *H01L 51/5044* (2013.01); *H01L 51/5206* (2013.01); *H01L 51/5221* (2013.01); *H01L 51/5237* (2013.01); *H01L 51/5268* (2013.01); *H01L 2251/5307* (2013.01); *H01L 2251/5361* (2013.01); *H01L 2251/5376* (2013.01)

(58) Field of Classification Search
CPC ............. H01L 51/5221; H01L 51/5268; H01L 51/5237; C09K 11/06
USPC ...................................... 257/40, 89, 98, 103
See application file for complete search history.

(56) References Cited

U.S. PATENT DOCUMENTS

| | | | |
|---|---|---|---|
| 9,184,404 B2 | 11/2015 | Kuzuoka et al. | |
| 2006/0087225 A1 | 4/2006 | Liao et al. | |
| 2006/0232194 A1 | 10/2006 | Tung et al. | |
| 2008/0278066 A1 | 11/2008 | Spindler et al. | |
| 2009/0230844 A1* | 9/2009 | Pfeiffer | H01L 51/5036 313/504 |
| 2012/0074392 A1 | 3/2012 | Huang et al. | |
| 2012/0248424 A1* | 10/2012 | Sasaki | H01L 51/504 257/40 |
| 2013/0056717 A1 | 3/2013 | Ishihara et al. | |
| 2014/0008632 A1 | 1/2014 | Kuzuoka et al. | |
| 2014/0009918 A1 | 1/2014 | Kubota et al. | |
| 2014/0016308 A1 | 1/2014 | Kubota et al. | |
| 2014/0022769 A1 | 1/2014 | Kubota et al. | |
| 2014/0191226 A1 | 7/2014 | Yamae | |
| 2016/0020431 A1 | 1/2016 | Yamae et al. | |

FOREIGN PATENT DOCUMENTS

| | | |
|---|---|---|
| JP | 4408382 | 11/2009 |
| JP | 2010-527108 | 8/2010 |
| JP | 4797438 | 10/2011 |
| WO | 2006/047170 | 5/2006 |
| WO | 2008/140675 | 11/2008 |
| WO | 2011/125090 | 10/2011 |
| WO | 2012/128079 | 9/2012 |
| WO | 2012/128116 | 9/2012 |
| WO | 2012/128117 | 9/2012 |
| WO | 2012/128118 | 9/2012 |
| WO | 2013/024787 | 2/2013 |

* cited by examiner

----------- BASE
------ 1ST-ORDER
——— 2ND-ORDER
— — — 3RD-ORDER
—·—·— 4TH-ORDER

ORGANIC ELECTROLUMINESCENT ELEMENT AND LIGHTING DEVICE

TECHNICAL FIELD

The present invention relates to an organic electroluminescent element and a lighting device provided with the same.

BACKGROUND ART

There has been generally known an organic electroluminescent element (also referred to as an "organic EL element" hereinafter) having a structure in which an anode constituted by a transparent electrode, a hole transport layer, a light-emitting layer, an electron injection layer, and a cathode are stacked in that order on the surface of a transparent substrate. In the organic EL element, a voltage is applied between the anode and the cathode so that light generates in the light-emitting layer and emerges to the outside through the transparent electrode and the transparent substrate.

To provide various luminescent colors to the organic EL element, the luminescent colors of light-emitting materials having different wavelengths are combined. In particular, to provide emission of light having an important color for an illumination application, three colors, namely those in red light emission, green light emission, and blue light emission, are combined. A fluorescent material and a phosphorescent material are known as light-emitting materials. Hence, an organic EL element having a multi-unit structure in which a fluorescent unit and a phosphorescent unit are stacked has been proposed (see JP 4408382 B2 and JP 4797438 B2, for example). The organic EL element having the multi-unit structure is also so-called a tandem-type element, and has a structure in which each light-emitting unit emits light, and therefore it has an advantage to form an element configuration that is suitable for each light-emitting unit.

However, the organic EL element having the multi-unit structure needs further improvement in luminous efficiency.

SUMMARY OF INVENTION

The present invention has been made in view of the above-described circumstances, and an object thereof is to provide an organic electroluminescent element and a lighting device having high luminous efficiency.

The present invention relates to an organic electroluminescent element. An organic electroluminescent element includes at least three light-emitting units. The at least three light-emitting units include one or more short-wavelength light-emitting units having a weighted average emission wavelength $\lambda_S$, which is indicated by Equation (1) below, of 380 nm or more and less than 550 nm, and two or more long-wavelength light-emitting units having a weighted average emission wavelength $\lambda_S$, which is indicated by Equation (1) below, of 550 nm or more and 780 nm or less. The two or more long-wavelength light-emitting units are greater in number than the one or more short-wavelength light-emitting units.

[Mathematical 1]

$$\lambda_S = \frac{\int_{380}^{780} P(\lambda) \times \lambda \, d\lambda}{\int_{380}^{780} P(\lambda) \, d\lambda} \quad (1)$$

In Equation (1), P(λ) indicates a spectrum intensity at a wavelength.

The present invention relates to a lighting device. The lighting device includes the above-described organic electroluminescent element.

According to the present invention, an organic electroluminescent element and a lighting device having high luminous efficiency can be obtained.

BRIEF DESCRIPTION OF DRAWINGS

FIG. 7A is an overall view and FIG. 7B is an enlarged view;

FIG. 8A is a schematic diagram of a light distribution pattern. FIG. 8B is a graph of radiant flux ratios;

FIG. 9A shows a plan view and FIG. 9B shows a cross-sectional view;

FIG. 10A is an example of a square grid. FIG. 10B is an example of a hexagonal grid;

DESCRIPTION OF EMBODIMENTS

An organic electroluminescent element (organic EL element) is disclosed by this specification. The organic EL element includes at least three light-emitting units 1. The at least three light-emitting units 1 include one or more short-wavelength light-emitting units 1S having a weighted average emission wavelength $\lambda_S$, which is indicated by Equation (1), of 380 nm or more and less than 550 nm, and two or more long-wavelength light-emitting units 1L having a weighted average emission wavelength $\lambda_S$, which is indicated by Equation (1), of 550 nm or more and 780 nm or less. The two or more long-wavelength light-emitting units 1L are greater in number than the one or more short-wavelength light-emitting units 1S. According to this organic EL element, the number of long-wavelength light-emitting units 1L is greater than that of the short-wavelength light-emitting units 1S, and thereby overall luminous efficiency can be increased. Therefore, an organic EL element having high luminous efficiency can be obtained.

Figure 1:
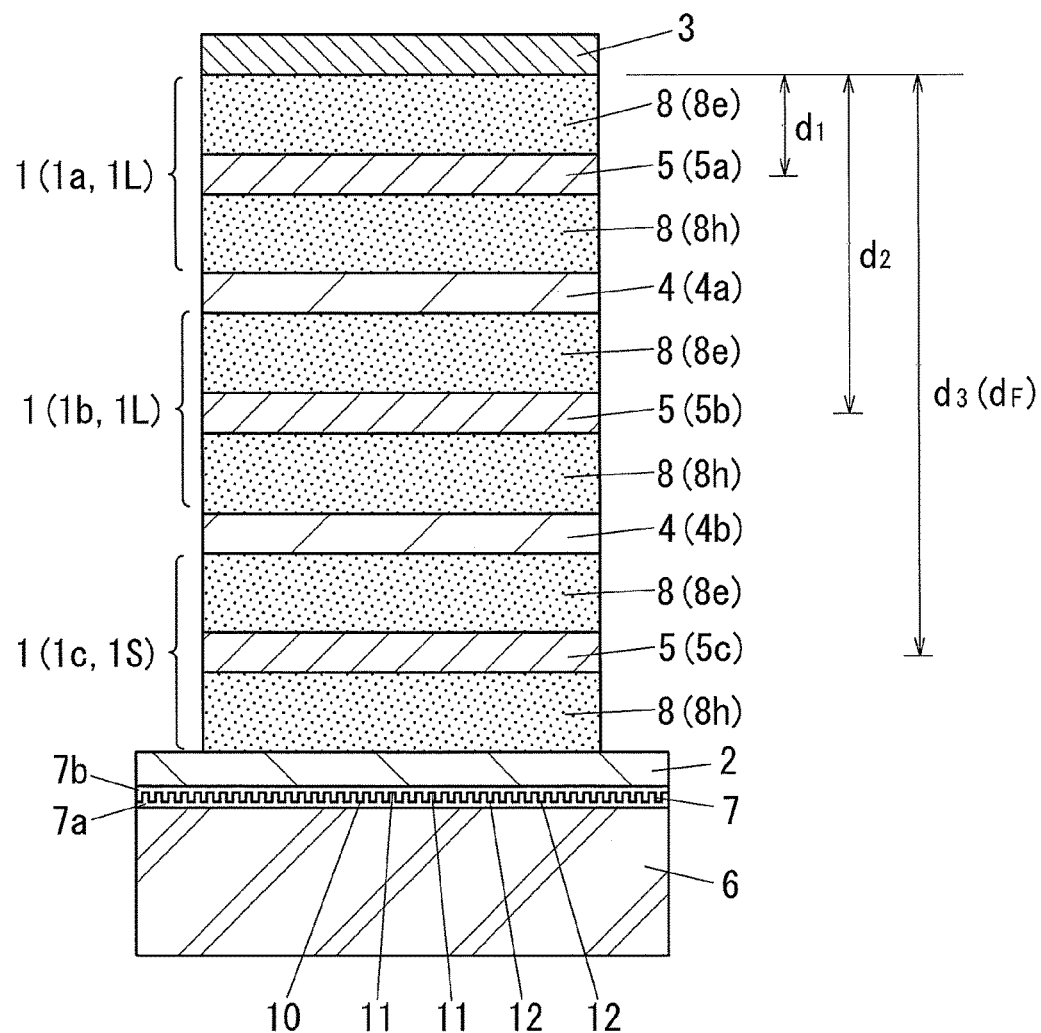
FIG. 1 is a cross-sectional view schematically showing an example of a layer configuration of an organic electroluminescent element.

FIG. 1 shows an example of a layer structure of an organic electroluminescent element (organic EL element).

The organic EL element includes at least three light-emitting units 1. The organic EL element of FIG. 1 includes three light-emitting units 1. Of course, the organic EL element may include four or more light-emitting units 1. However, the element design tends to become more complicated if the number of light-emitting units 1 increases, and therefore in view of this point, the number of light-emitting units 1 is preferably seven or less, more preferably five or less, even more preferably four or less, and still more preferably three.

The light-emitting unit 1 has a layer structure with a function of emitting light if a voltage is applied with the light-emitting unit 1 being sandwiched between an anode and a cathode. A structure in which a plurality of the light-emitting units 1 are included is referred to as a "multi-unit structure". In the multi-unit structure, a plurality of light-emitting units 1 that are stacked in layers are electrically connected in series and disposed between one anode and one cathode.

Each of the light-emitting units 1 has a light-emitting layer 5. The light-emitting layer 5 is a layer containing a light-emitting material (dopant). The light-emitting layer 5 is made of a light-emitting material and a host material accepting the light-emitting material. In one light-emitting unit 1, the light-emitting layer 5 may have a single-layer structure, or may have a multiple-layer structure.

The at least three light-emitting units 1 are sandwiched by a pair of electrodes. In the pair of electrodes, one electrode serves as the anode and the other electrode serves as the cathode. In FIG. 1, the light-emitting units 1 are disposed between a light transmissive electrode 2 and a light reflective electrode 3. If the light reflective electrode 3 is present, more light can emerge to the outside due to light reflection properties. The light transmissive property means transparency or translucency. Hereinafter, description will be given focusing on an organic EL element in which the anode is constituted by the light transmissive electrode 2, and the cathode is constituted by the light reflective electrode 3. Of course, the anode may be constituted by the light reflective electrode 3, and the cathode may be constituted by the light transmissive electrode 2.

An interlayer 4 is provided between adjoining light-emitting units 1. The interlayer 4 is a layer that is capable of giving electrons to the light-emitting unit 1 on the anode side, and giving positive holes (holes) to the light-emitting unit 1 on the cathode side. The interlayer 4 may be constituted by an electrical charge generation layer. The interlayer 4 is a layer disposed between two light-emitting units 1. Accordingly usually, the number of interlayers 4 is smaller than the number of light-emitting units 1. When an organic EL element includes three or more light-emitting units 1, the organic EL element includes a plurality of the interlayers 4 (two or more). In FIG. 1, the number of interlayers 4 is two.

An organic light-emitting stacked body includes a layer structure extending from the light transmissive electrode 2 to the light reflective electrode 3, or in other words, includes the light transmissive electrode 2, the light-emitting units 1, the interlayers 4, and the light reflective electrode 3. The organic light-emitting stacked body is a stacked body that emits light due to a voltage being applied thereto. The organic light-emitting stacked body is formed on a substrate 6.

In FIG. 1, the light transmissive electrode 2 is disposed on the side, of the substrate 6, of the organic light-emitting stacked body. The substrate 6 is a base material supporting the organic light-emitting stacked body. The light transmissive electrode 2, the light-emitting units 1, and the light reflective electrode 3 are supported by the substrate 6. When the layers are stacked, the layers may be formed in the stated order starting from the side of the substrate 6. This organic EL element makes light emerge through the substrate 6. The organic EL element has a so-called bottom emission structure. In this case, the substrate 6 is preferably light transmissive. Of course, the organic EL element may have a structure in which light emerges from the side opposite to the substrate 6 (top emission structure). In this case, the substrate 6 may be disposed on the side, of the light reflective electrode 3, of the organic light-emitting stacked body.

In FIG. 1, a light diffusion layer 7 is provided between the substrate 6 and the light transmissive electrode 2. The organic EL element preferably includes the light diffusion layer 7 between the substrate 6 and the light transmissive electrode 2. The light diffusion layer 7 has a function of extracting more light that travels in a direction oblique to the substrate 6. Light extraction properties can be improved by the light diffusion layer 7. Of course, the light diffusion layer 7 may be provided as needed.

The light-emitting unit 1 preferably includes an electrical charge transfer layer 8 that transfers electrical charge to the light-emitting layer 5. The electrical charge (electron or positive hole) can be smoothly transferred to the light-emitting layer 5 by the electrical charge transfer layer 8.

A layer for promoting the transfer of positive holes from the anode or the interlayer 4 to the light-emitting layer 5 may be provided on the side, of the anode, of the light-emitting layer 5 (in this example, the light transmissive electrode 2), as the electrical charge transfer layer 8. In the example of FIG. 1, a positive hole transport layer 8h is provided on the side, of the light transmissive electrode 2, of the light-emitting layer 5. A positive hole injection layer may be further provided between the positive hole transport layer 8h and the electrode, or between the positive hole transport layer 8h and the interlayer 4. Accordingly, positive hole injection capabilities are improved, and electrical charge can be even more smoothly transferred.

A layer for promoting the transfer of electrons from the cathode or the interlayer 4 to the light-emitting layer 5 may be provided on the side, of the cathode, of the light-emitting layer 5 (in this example, the light reflective electrode 3 side), as the electrical charge transfer layer 8. In the example of FIG. 1, an electron transport layer 8e is provided on the side, of the light reflective electrode 3, of the light-emitting layer 5. An electron injection layer may be further provided between the electron transport layer 8e and the electrode, or between the electron transport layer 8e and the interlayer 4. Accordingly, electron injection capabilities are improved, and electrical charge can be even more smoothly transferred.

In FIG. 1, the reference signs of the constituents in the organic EL element can be defined orderly starting from the light reflective electrode 3. This organic EL element includes three light-emitting units 1. Accordingly, it can be said that the three light-emitting units 1 include a first light-emitting unit 1a, a second light-emitting unit 1b, and a third light-emitting unit 1c in this order starting from the side of the light reflective electrode 3. This organic EL element includes two interlayers 4. Accordingly, it can be said that the two interlayers 4 include a first interlayer 4a and a second interlayer 4b in this order starting from the side of the light reflective electrode 3. The first interlayer 4a is the interlayer 4 disposed between the first light-emitting unit 1a and the second light-emitting unit 1b. The second interlayer 4b is the interlayer 4 disposed between the second light-emitting unit 1b and the third light-emitting unit 1c.

The light-emitting layer 5 in the first light-emitting unit 1a is defined as a first light-emitting layer 5a. The light-emitting layer 5 in the second light-emitting unit 1b is defined as a second light-emitting layer 5b. The light-emitting layer 5 in the third light-emitting unit 1c is defined as a third light-emitting layer 5c.

In the organic EL element, the at least three the light-emitting units 1 include one or more short-wavelength light-emitting units 1S and two or more long-wavelength light-emitting units 1L. In a preferable aspect of an organic EL element, the at least three light-emitting units 1 include one short-wavelength light-emitting unit 1S and two long-wavelength light-emitting units 1L. In the example of FIG. 1, the organic EL element includes one short-wavelength light-emitting unit 1S and two long-wavelength light-emitting units 1L. In the case where the number of light-emitting units 1 is three, light extraction properties can be improved with a more simple structure.

The short-wavelength light-emitting unit 1S is a light-emitting unit 1 having a weighted average emission wavelength $\lambda_S$, which is indicated by Equation (1) below, of 380 nm or more and less than 550 nm. The long-wavelength light-emitting unit 1L is a light-emitting unit 1 having a weighted average emission wavelength $\lambda_S$, which is indicated by Equation (1) below, of 550 nm or more and 780 nm or less. In other words, the short-wavelength light-emitting unit 1S is a light-emitting unit 1 that mainly emits light having a wavelength that is shorter than 550 nm in the visible light range, and the long-wavelength light-emitting unit 1L is a light-emitting unit 1 that mainly emits light having a wavelength that is longer or equal to 550 nm in the visible light range. Hence, the weighted average emission wavelength $\lambda_S$ is a wavelength indicated by Equation (1) below, and is obtained by integrating an emission spectrum.

[Mathematical 2]

$$\lambda_S = \frac{\int_{380}^{780} P(\lambda) \times \lambda \, d\lambda}{\int_{380}^{780} P(\lambda) \, d\lambda} \qquad (1)$$

In the equation above, $P(\lambda)$ indicates a spectrum intensity at a wavelength. Note that $\lambda$ indicates a wavelength, and is a variable from 380 (nm) to 780 (nm).

As shown in Equation (1), the weighted average emission wavelength $\lambda_S$ is a wavelength obtained by weighting wavelengths in accordance with light intensity and averaging the weighted wavelengths. An element having high light extraction efficiency can be configured by means of the weighted average emission wavelength $\lambda_S$ in this manner. The weighted average emission wavelength $\lambda_S$ is obtained from the emission spectrum of the light-emitting unit 1.

Hence, the weighted average emission wavelength $\lambda_S$ of the light-emitting unit 1 is defined as the wavelength of an individual light-emitting unit 1. In the case where the light-emitting unit 1 contains one light-emitting material, the weighted average emission wavelength of this light-emitting material serves as the weighted average emission wavelength $\lambda_S$ of the light-emitting unit 1. In the case where the light-emitting unit 1 contains two or more light-emitting materials, the weighted average emission wavelength of the emission spectrum generated through combining these light-emitting materials in the light-emitting unit 1 serves as the weighted average emission wavelength $\lambda_S$ of the light-emitting unit 1. The case in which the light-emitting unit 1 contains two or more light-emitting materials encompasses cases in which a plurality of light-emitting layers 5 are provided and cases in which one light-emitting layer 5 contains a plurality of light-emitting materials.

In the organic EL element, the two or more long-wavelength light-emitting units 1L are greater in number than the one or more short-wavelength light-emitting units 1S. In FIG. 1, there are two long-wavelength light-emitting units 1L and one short-wavelength light-emitting unit 1S, and thus the long-wavelength light-emitting units 1L are greater in number than the short-wavelength light-emitting units 1S. In other words, the three light-emitting units 1 include one short-wavelength light-emitting unit 1S and two long-wavelength light-emitting units 1L. Even in the case of four or more light-emitting units 1, similarly, a plurality of light-emitting units 1 are configured such that the long-wavelength light-emitting units 1L are greater in number than the short-wavelength light-emitting units 1S.

The luminous efficiency of the long-wavelength light-emitting unit 1L is preferably higher than the luminous efficiency of the short-wavelength light-emitting unit 1S. For example, in the case of a configuration in which the long-wavelength light-emitting unit 1L contains a phosphorescent material and the short-wavelength light-emitting unit 1S contains a fluorescent material, the luminous efficiency of the long-wavelength light-emitting unit 1L can be easily made higher than the luminous efficiency of the short-wavelength light-emitting unit 1S.

If the long-wavelength light-emitting units 1L are greater in number than the short-wavelength light-emitting units 1S, by increasing the number of long-wavelength light-emitting units 1L having higher luminous efficiency, the luminous efficiency of the entire light-emitting units can be increased, and an element can provide high light extraction properties. Also, as a result of the organic EL element including two or more long-wavelength light-emitting units 1L, luminescent colors can be easily adjusted to various colors, and an organic EL element having a wide color reproduction area can be obtained. Therefore, an organic EL element having high luminous efficiency and excellent chromogenicity can be obtained. In particular, in the case where the organic EL element is used in illumination applications, highly efficient light emission can be realized. In an organic EL element having a conventional multi-unit structure, the overall efficiency is likely to decrease due to a light-emitting unit having low efficiency. However, the above-described organic EL element, which includes the plurality of light-emitting units as described above, can improve the luminous efficiency more than the organic EL element having the conventional multi-unit structure. Also, in the organic EL element, a longer life and little color shifting, which are important for illumination applications, can be improved.

In FIG. 1, in the organic EL element, the first light-emitting unit 1a and the second light-emitting unit 1b are the long-wavelength light-emitting units 1L, and the third light-emitting unit 1c is the short-wavelength light-emitting unit 1S. Therefore, the long-wavelength light-emitting units 1L are greater in number than the short-wavelength light-emitting units 1S. Of course, the location of the long-wavelength and short-wavelength light-emitting units 1 is not limited thereto. In the case where the number of light-emitting units 1 is three, it is sufficient that one of the first light-emitting unit 1a, the second light-emitting unit 1b, and the third light-emitting unit 1c is the short-wavelength light-emitting unit 1S, and the remaining two light-emitting units 1 are the long-wavelength light-emitting units 1L.

In the organic EL element, the at least three light-emitting units 1 preferably include at least one light-emitting unit containing a plurality of light-emitting materials. As a result of the at least one light-emitting unit 1 containing a plurality of light-emitting materials, the light-emitting units 1 can emit light with the light emission properties of the light-emitting materials being compensated, and therefore the luminous efficiency can be increased. Specifically, a plurality of light-emitting materials may emit light with a lower voltage than one light-emitting material, thereby eliminating the need to deliberately reduce light emission properties to adjust colors. The number of light-emitting units 1 containing a plurality of light-emitting materials may be one, two, or three or more.

In a preferable aspect of the light-emitting unit 1 containing a plurality of light-emitting materials, the number of types of light-emitting material is two. In the light-emitting unit 1 containing two types of light-emitting material, it is possible to cause one light-emitting material to function as a main light emission component for luminescent color and cause the other light-emitting material to function as an auxiliary component for producing the luminescent color of the light-emitting unit 1. Therefore, the luminescent color of the light-emitting unit 1 can be easily adjusted, and the color of the whole element can be easily adjusted. The number of light-emitting units 1 containing two types of light-emitting material may be one, two, or three or more. For example, in the example of FIG. 1, the number of light-emitting units 1 containing two types of light-emitting material is preferably two because the design can be simplified and the color can be easily adjusted.

In a preferable aspect, the at least three light-emitting units 1 include a phosphorescent unit and a fluorescent unit. The phosphorescent unit is a light-emitting unit 1 containing a phosphorescent material. The fluorescent unit is a light-emitting unit 1 containing a fluorescent material. In FIG. 1, the first light-emitting unit 1a and the second light-emitting unit 1b may be phosphorescent units. Also, the third light-emitting unit 1c may be a fluorescent unit. The phosphorescent unit preferably contains only the phosphorescent material as the light-emitting material. The fluorescent unit preferably contains only the fluorescent material as the light-emitting material. The reason for this is that a light-emitting unit 1 containing the same type of light-emitting materials is advantageous for light emission and designing than a light-emitting unit 1 containing both the phosphorescent material and the fluorescent material.

Incidentally, there is a difference in luminous efficiency and life of the light-emitting material due to the difference between fluorescence and phosphorescence, and it is not easy to obtain high performance light emission through unifying light-emitting materials for all colors into either phosphorescence or fluorescence. In particular, it is difficult to select a short-wavelength light-emitting material exhibiting blue. For example, in general, a fluorescent material having short-wavelength has a long life, but has low luminous efficiency. On the other hand, a phosphorescent material has high luminous efficiency, but it is difficult to obtain a phosphorescent material that has a long life and a short wavelength. Therefore, a multi-unit structure including a phosphorescent unit and a fluorescent unit is advantageous in achieving both a long life and high luminous efficiency.

The long-wavelength light-emitting unit 1L is preferably a phosphorescent unit. Accordingly, the efficiency can be increased. Also, a longer life can be achieved. The short-wavelength light-emitting unit 1S is preferably a fluorescent unit. Accordingly, light emission with a longer life and higher efficiency can be obtained. The phosphorescent units are preferably greater in number than the fluorescent units. Accordingly, the efficiency can be further increased. In this manner, if the fluorescent units provides emission of light having a short wavelength and the phosphorescent units provides emission of light having a long wavelength, both a longer life and higher efficiency can be achieved. Note that if the number of light-emitting units 1 is four or more, the number of phosphorescent units may be set to three or more. Also, a plurality of fluorescent units may be provided such that the phosphorescent units are greater in number than the fluorescent units.

The light-emitting layer 5 of the light-emitting unit 1 contains the light-emitting material. An appropriate light-emitting material can be used as the light-emitting material in the light-emitting layer 5. Examples of the light-emitting material include a red light-emitting material, a green light-emitting material, a blue light-emitting material, a yellow light-emitting material, an orange light-emitting material, and a purple light-emitting material. These light-emitting materials are classified by the colors of light emitted. Of course, light-emitting materials having other colors may be used. When visible light is segmented into red (R), green (G), and blue (B), red, green, and blue are in the stated order starting from the long-wavelength side. Therefore, it is easy to produce the long-wavelength light-emitting unit 1L with the red light-emitting material. Also, it is easy to produce the short-wavelength light-emitting unit 1S with the blue light-emitting material. In the case of the green light-emitting material, the light may have a long wavelength or short wavelength. The light-emitting unit 1 containing both the red light-emitting material and the green light-emitting material can serve as the long-wavelength light-emitting unit 1L. The light-emitting unit 1 containing both the blue light-emitting material and the green light-emitting material can serve as the short-wavelength light-emitting unit 1S.

The light-emitting layer 5 in the light-emitting unit 1 may be a single layer or a multiple layer. The light-emitting layer 5 may only contain one light-emitting material or may contain a plurality of light-emitting materials. In the case where the light-emitting layer 5 contains a plurality of light-emitting materials, the light-emitting layer 5 may be configured to be a mixed layer in which a plurality of light-emitting materials are mixed in a single layer, or to have a layer structure in which a plurality of layers each containing one light-emitting material are stacked.

Examples of the light-emitting material for the long-wavelength light-emitting unit 1L include the red light-emitting material and the green light-emitting material. Examples of the long-wavelength light-emitting unit 1L include a single layer containing the red light-emitting material, a single layer containing the green light-emitting material, a stack of a layer containing the red light-emitting material and a layer containing the green light-emitting material, and a layer in which the red light-emitting material and the green light-emitting material are mixed. Also, if the condition of a long wavelength is satisfied, the long-wavelength light-emitting unit may have a stack of a layer containing the red light-emitting material and a layer containing the blue light-emitting material, a layer in which the red light-emitting material and the blue light-emitting material are mixed, a layer made of a yellow light-emitting material, a layer made of an orange light-emitting material, or the like. Of course, a light-emitting material other than these light-emitting materials may be used. In short, it is sufficient that the weighted average emission wavelength $\lambda_S$ of one long-wavelength light-emitting unit 1L is 550 nm or more as a whole.

Examples of the light-emitting material for the short-wavelength light-emitting unit 1S include the blue light-emitting material and the green light-emitting material. Examples of the short-wavelength light-emitting unit 1S includes a single layer containing the blue light-emitting material, a single layer containing the green light-emitting material, a stack of a layer containing the blue light-emitting material and a layer containing the green light-emitting material, and a layer in which the blue light-emitting material and the green light-emitting material are mixed. Also, if the condition of a short wavelength is satisfied, the short-wavelength light-emitting unit may have a stack of a layer containing the blue light-emitting material and a layer containing the red light-emitting material, a layer in which the blue light-emitting material and the red light-emitting material are mixed, a layer made of a purple light-emitting material, or the like. Of course, a light-emitting material other than these light-emitting materials may be used. In short, it is sufficient that the weighted average emission wavelength $\lambda_S$ of one short-wavelength light-emitting unit 1S is less than 550 nm as a whole.

Incidentally, strictly speaking, the shape of an emission spectrum and the weighted average emission wavelength of the light-emitting unit 1 may vary in accordance with optical interference, the refractive index of the substrate 6, light emission structure, viewing angle, and the like. Hence, the weighted average emission wavelength of the light-emitting unit 1 in an element may be a weighted average emission wavelength when assuming only the light-emitting unit 1 as a single-unit structure. That is, the weighted average emission wavelength $\lambda_S$ can be obtained as follows. First, an emission spectrum in the front direction is obtained with a simple structure (single-unit structure that does not include an uneven structure for extracting light and in which the light-emitting unit is stacked on a glass substrate) that enables Fresnel analysis. Next, this emission spectrum is divided by the front spectrum obtained in the case where all of the wavelengths have the same intensity with Fresnel analysis software that enables optical interference calculations. Moreover, interference is cancelled to extract a spectrum and the extracted spectrum is integrated to calculate an average wavelength. The wavelength calculated in this manner serves as a weighted average emission wavelength $\lambda_S$. The spectrum obtained in this manner has a high correlation with a specific spectrum of the light-emitting material.

[Light-Emitting Unit Design]

Figure 2:
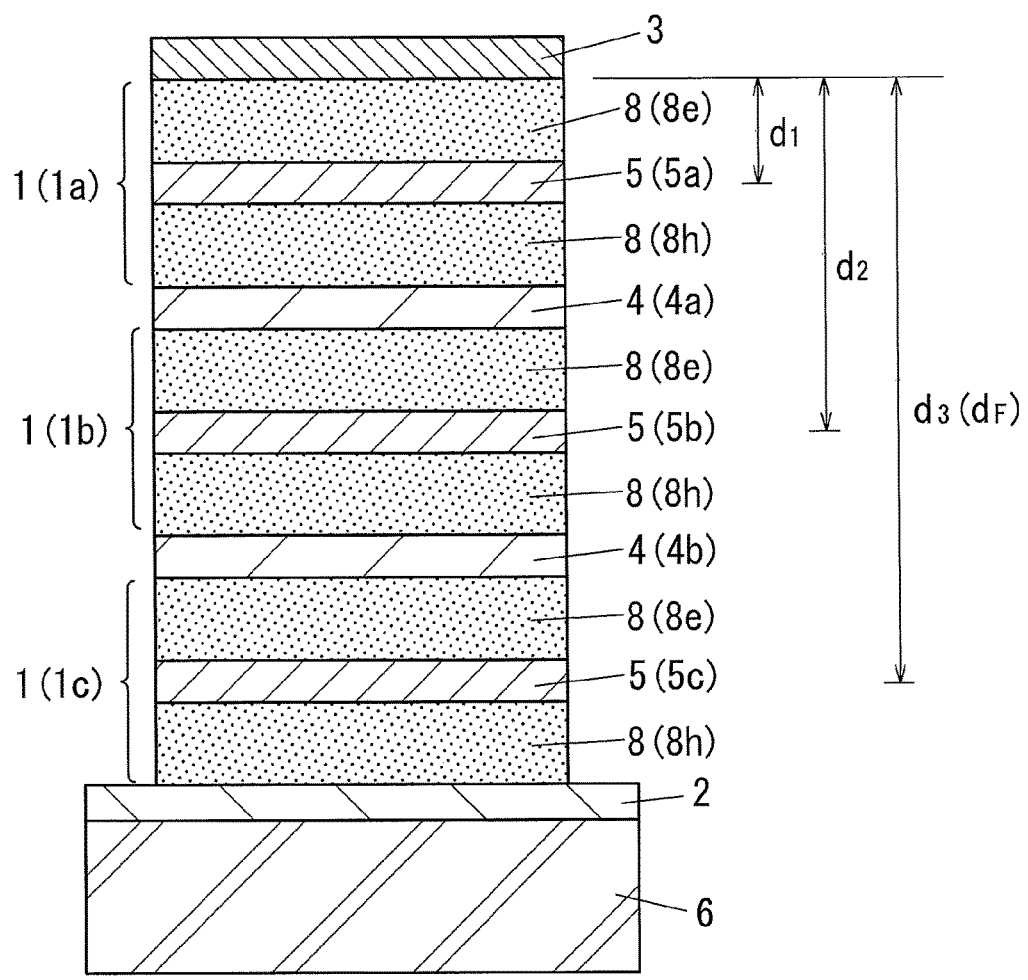
FIG. 2 is a cross-sectional view schematically showing an example of a layer configuration of an organic electroluminescent element.

An organic EL element is designed based on the organic EL element having the layer configuration shown in FIG. 2, with the configuration of the light-emitting layer 5 being modified, and the reason why the above-described configuration is favorable and a more preferable aspect will be described. The organic EL element of FIG. 2 has a layer configuration similar to the organic EL element of FIG. 1, except that the light diffusion layer 7 is excluded from the organic EL element of FIG. 1. However, the light emission wavelength of the light-emitting layer 5 or the like is modified as appropriate. The same reference signs are used to denote configurations that are the same as those of FIG. 1, and description thereof is omitted. By omitting the light diffusion layer 7, the element can be simplified and preferably designed.

The substrate 6 is made of glass and serves as a light transmissive substrate. ITO is used for the light transmissive electrode 2, and Al is used for the light reflective electrode 3. Of course, the material may be modified appropriately as long as configurational requirements of the elements are satisfied.

First, an organic EL element was produced in which the first light-emitting unit 1a and the second light-emitting unit 1b were the long-wavelength light-emitting units 1L, and the third light-emitting unit 1c was the short-wavelength light-emitting unit 1S. If these units are classified according to the type of light emission, the first light-emitting unit 1a and the second light-emitting unit 1b were the phosphorescent units, and the third light-emitting unit 1c was the fluorescent unit. Unless otherwise stated, the long-wavelength light-emitting unit 1L was the phosphorescent unit and the short-wavelength light-emitting unit 1S was the fluorescent unit in the examples that will be described later as well.

Table 1 shows an overview of light-emitting materials used to design organic EL elements.

TABLE 1

|  | First light-emitting unit | Second light-emitting unit | Third light-emitting unit |
| --- | --- | --- | --- |
| Element Ex. 1 | green (long-wavelength unit) | red (long-wavelength unit) | blue (short-wavelength unit) |
| Element Ex. 2 | red + green (long-wavelength unit) | red + green (long-wavelength unit) | blue (short-wavelength unit) |
| Comp. Element Ex. 1 | red + green (long-wavelength unit) | blue (short-wavelength unit) | — |

In Element Example 1, the first light-emitting unit 1a contained only the green light-emitting material, the second light-emitting unit 1b contained only the red light-emitting material, and the third light-emitting unit 1c contained only the blue light-emitting material.

In Element Example 2, the first light-emitting unit 1a contained the red light-emitting material and the green light-emitting material, the second light-emitting unit 1b contained the red light-emitting material and the green light-emitting material, and the third light-emitting unit 1c contained the blue light-emitting material. In the first light-emitting unit 1a and the second light-emitting unit 1b, by changing the ratio of red and green light-emitting materials, it is possible to use one of the red and green light-emitting materials as a main light emission component, and use the other as an auxiliary component. Light having a color of the main light emission component is mainly emitted from the light-emitting unit 1. The auxiliary component has a function of aiding light emission of the main light emission component.

For comparison, an organic EL element including just two light-emitting units 1 was designed as Comparative Element Example 1.

Figure 3:
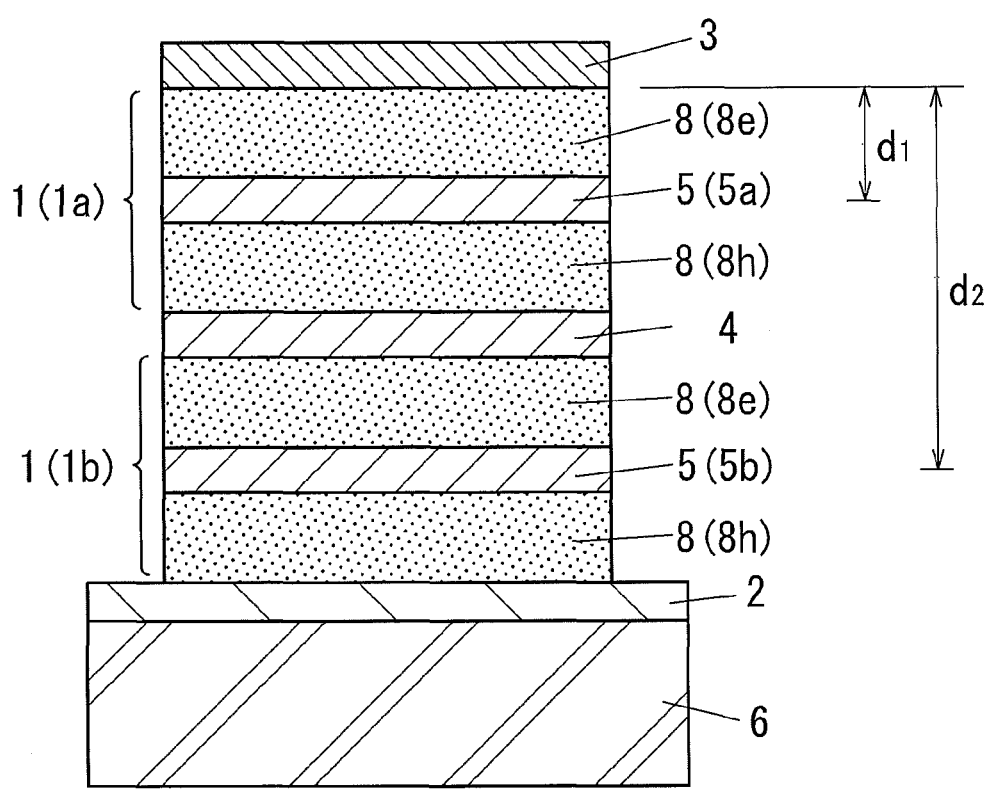
FIG. 3 is a cross-sectional view schematically showing an example of a layer configuration of a comparative element.

FIG. 3 shows a layer configuration of the organic EL element of Comparative Element Example 1. The same reference signs are used to denote the configurations that are similar to those of FIG. 1, and description thereof is omitted. As shown in Table 1, in Comparative Element Example 1, the first light-emitting unit 1a contained the red light-emitting material and the green light-emitting material, and the second light-emitting unit 1b contained the blue light-emitting material.

In Element Examples 1 and 2 and Comparative Element Example 1, the same light-emitting material was used as the light-emitting material. That is, the same red light-emitting material, the same green light-emitting material, and the same blue light-emitting material were used. Accordingly, it is possible to compare not differences in light-emitting material but differences in layer configuration.

Table 2 shows an overview of each light-emitting unit 1 in Element Examples 1 and 2 and Comparative Element Example 1. EQE indicates the external quantum efficiency in the case where an individual unit is evaluated. The weighted average emission wavelength $\lambda_S$ is calculated for each unit. Hence, the weighted average emission wavelengths of the first light-emitting unit 1a and the second light-emitting unit 1b of Element Example 2 may vary in a range of 580 to 650 nm, in accordance with the ratio between the red light-emitting material and the green light-emitting material. That is, the wavelength can be adjusted with the ratio between the red light-emitting material and the green light-emitting material. The same can be said of the first light-emitting unit 1a of Comparative Element Example 1.

TABLE 2

|  | First light-emitting unit | | Second light-emitting unit | | Third light-emitting unit | |
| --- | --- | --- | --- | --- | --- | --- |
|  | $\lambda_S$ (nm) | EQE (%) | $\lambda_S$ (nm) | EQE (%) | $\lambda_S$ (nm) | EQE (%) |
| Element Ex. 1 | 580 | 20 | 650 | 20 | 480 | 6 |
| Element Ex. 2 | 580 to 650 | 20 | 580 to 650 | 20 | 480 | 6 |
| Comp. Element Ex. 1 | 580 to 650 | 20 | 480 | 6 | — | — |

Table 3 shows results regarding elements on which color adjustment was performed through changing external quantum efficiency (EQE) and red and green emission intensities, based on Element Examples 1 and 2 and Comparative Element Example 1. Two types of elements (1-1 and 1-2) and three types of elements (2-1, 2-2, and 2-3) were respectively produced in Element Example 1 and Element Example 2. EQE was expressed by red (R), green (G), and blue (B).

TABLE 3

|  |  | Number of light-emitting units | EQE (%) | | | Efficiency (lm/W) | Whiteness | Chromaticity |
| --- | --- | --- | --- | --- | --- | --- | --- | --- |
|  |  |  | R | G | B |  |  |  |
| Element Ex. 1 | Element Ex. 1-1 | 3 | 20 | 20 | 6 | 33 | + | (0.47, 0.39) |
|  | Element Ex. 1-2 | 3 | 14 | 20 | 6 | 31 | ++ | (0.44, 0.41) |
| Element Ex. 2 | Element Ex. 2-1 | 3 | 40 | 0 | 6 | 19 | x (pink) | (0.53, 0.29) |
|  | Element Ex. 2-2 | 3 | 17 | 23 | 6 | 36 | ++ | (0.46, 0.41) |
|  | Element Ex. 2-3 | 3 | 0 | 40 | 6 | 49 | x (greenish yellow) | (0.42, 0.47) |
| Comp. Element Ex. 1 |  | 2 | 6 | 14 | 6 | 99 | ++ | (0.40, 0.39) |

In Table 3, with regard to the whiteness, the case in which a white color was recognized is expressed by +, and a white color having a higher whiteness is expressed by ++. The case in which deviation from a white color is recognized is expressed by x, and the type of color is written.

Figures 4, 5:
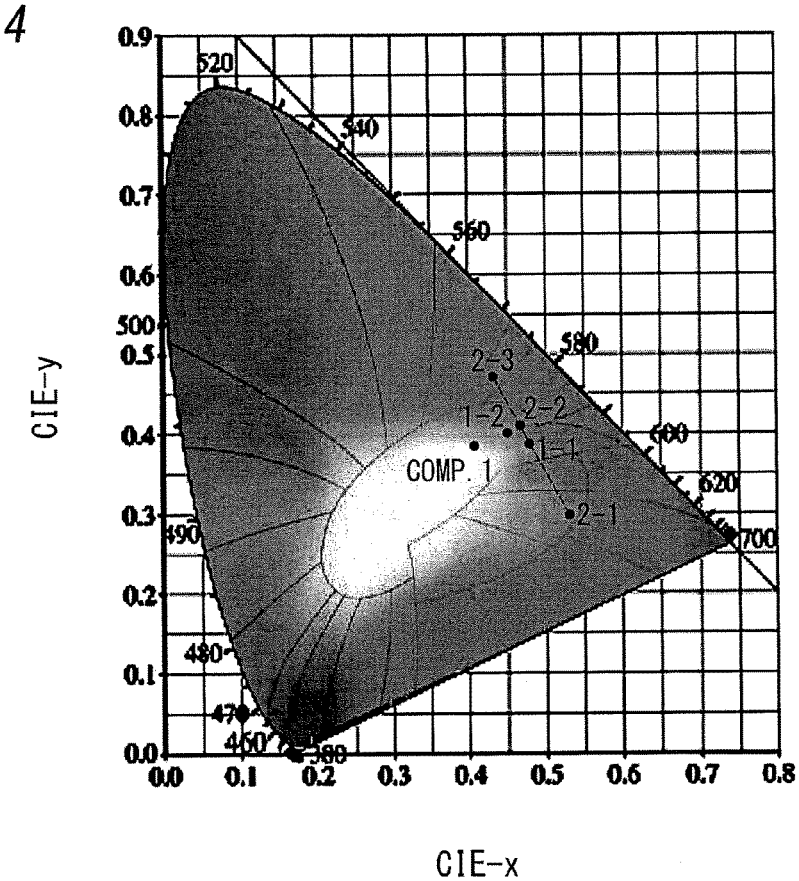
FIG. 4 is a chart illustrating CIE1931 color coordinates and luminescent color points of element examples in the color coordinates.
FIG. 5 is a graph showing a relationship between a wavelength $\lambda_S$ and a distance $d_F$ in a light-emitting layer of a light-emitting unit located the farthest from a light reflective electrode.

FIG. 4 shows CIE chromaticity coordinates (CIE1931 chromaticity coordinates). The horizontal axis is CIE-x and the vertical axis is CIE-y in the chromaticity coordinates. FIG. 4 shows positions of color coordinates of light emitted from the element examples and comparative element example as points. Approximately, the center of a white region is located around (x, y)=(0.35, 0.35).

Color adjustment (adjustment of red and green light emission intensities) was performed on Element Examples 1-2 and 2-2 and Comparative Element Example 1 so that the points are located in the white region. In particular, color adjustment (adjustment of red and green light emission intensities) was performed on Element Examples 1-2 and 2-2 so that an increase in whiteness could be achieved.

Comparing Element Examples and Comparative Element Example, the efficiency tends to increase due to three light-emitting units 1 including one short-wavelength light-emitting unit 1S and two long-wavelength light-emitting units 1L which are provided in number more than short-wavelength light-emitting unit 1S. It is conceivable that this is because the overall quantum efficiency is more increased seemingly by setting the number of long-wavelength light-emitting units 1L to two, compared with setting the number of long-wavelength light-emitting units 1L to one. Furthermore, Element Example 2-2, in which at least one light-emitting unit 1 contained a plurality of light-emitting materials, had higher efficiency than that of Element Example 1-1, in which each light-emitting unit 1 was made of a single light-emitting material. It is conceivable that this is because Element Example 2-2 includes the light-emitting unit 1 containing two types of light-emitting materials (red and green), and therefore the color can be adjusted without reducing the red or green luminous efficiency, as a result of which a white color can be obtained with high efficiency. In other words, it can be said that Element Example 2-2 is configured to more sufficiently exhibit performance of each light-emitting material and emit light. Also, in Element Example 2, the ratio of red and green light emission intensities can be changed dramatically. Table 3 indicates that Element Example 2-1 can emit pink light, which is a color that deviates slightly from white colors. Table 3 indicates that Element Example 2-3 can emit greenish yellow light, which is a color that deviates slightly from white colors. In other words, as shown by a broken line in FIG. 4, a luminescent color on a straight line that connects a 2-1 point and a 2-3 point can be obtained by changing red and green light emission intensities. In FIG. 4, a white region is present on the straight line that connects the 2-1 point and the 2-3 point. Therefore, it is possible to obtain emission of light having colors in a wide range with high efficiency. For example, emission of light having different color temperatures can be easily obtained.

Incidentally, white colors in illumination applications encompass various types of white color. Examples of white colors in illumination applications include a yellowish white color, a reddish white color, a greenish white color, and a bluish white color. White light refers to light largely including light in a visible range. For example, the white color of the organic EL element may have a color temperature of 1500 K or more and 10000 K or less. The color of a candlelight-like color is included in the white color.

Note that Element Examples 1 and 2 are merely examples, and the color reproduction range of luminescent colors can be increased more by combining light-emitting materials and adjusting the quantum efficiency.

Examples of Preferred Luminescent Color

In a preferable aspect, a color temperature of a luminescent color of the organic EL element is 2500 K or less. Accordingly, a lighting device with high efficiency can be realized. The organic EL element is useful for lighting having a color temperature of 2500 K or less. A luminescent color having a color temperature of 2500 K or less is unlikely to be realized with a LED made of an inorganic material, and even if it is realized, the efficiency is very low. This is because in a LED made of an inorganic material, conversion from the wavelength of blue to the wavelength of red is needed in order to achieve a luminescent color having a color temperature of 2500 K or less, and the loss in the conversion is significant.

The color having a color temperature of 2500 K or less is likely to have a calming effect on human, and thus is suitable for a lighting application. Hence, it is known that blue light, which is greatly in light having a high color temperature, suppresses the secretion of a sleep-inducing hormone called melatonin, which adversely affects biological rhythm (circadian rhythm), as with a sleep disorder. Also, a phenomenon called blue hazard has been reported in which blue light reaches the retina with high energy, and stimulates the retina, and adversely affects the eyes. However, light having a color temperature of 2500 K or less is likely to have a calming effect and can suppress adverse effects caused by a high color temperature. If human receives light having a color temperature of 2500 K or less before sleeping, pleasant sleep is likely to be obtained. Lighting having a color temperature of 2500 K or less is advantageous for the health of a human body.

The color temperature of a luminescent color of an organic EL element is preferably 1500 K or more. As a result of the color temperature being 1500 K or more, a luminescent color can be more suitable for illumination applications. In view of this point, the color temperature is preferably 1800 K or more. The color temperature of the luminescent color of the organic EL element is preferably 2300 K or less, and more preferably 2000 K or less.

A more preferable aspect of the luminescent color of the organic EL element may be defined by a light spectrum. In a more preferable aspect, the spectrum of light emitted from the organic EL element shows the quantity of light having a wavelength of 600 to 700 nm is five or more times and 50 or fewer times the quantity of light having a wavelength of 400 to 500 nm. The former wavelength region indicates a red component, and the latter wavelength region indicates a blue component. Therefore, it can be said that in this aspect, there is a greater amount of the red component than the blue component. Accordingly, the luminescent color can be closer to a candlelight-like color. Also, as a result of the red component increasing, the color rendering property can increase. The quantity of light can be obtained by integrating a light spectrum. The same can be said of the following.

In a preferable aspect, the spectrum of light emitted from the organic EL element shows that the quantity of light having a wavelength of 600 to 700 nm is 1.5 or more times and five or fewer times the quantity of light having a wavelength of 500 nm to 600 nm. The former wavelength region indicates a red component, and the latter wavelength region indicates a green component. Therefore, it can be said that in this aspect, there is a greater amount of the red component than the green component. Accordingly, the luminescent color can be closer to a candlelight-like color. Also, as a result of the red component increasing, the color rendering property can increase. It is more preferable that the spectrum of light show that the quantity of light having a wavelength of 600 to 700 nm is five or more times and 50 or fewer times the quantity of light having a wavelength of 400 to 500 nm, and 1.5 or more times and five or fewer times the quantity of light having a wavelength of 500 to 600 nm. Accordingly, the luminescent color can be closer to a candlelight-like color.

It is preferable that the spectrum of light emitted from the organic EL element show that the quantity of light having a wavelength of 380 nm or less is 0.001 or fewer times the quantity of light having a wavelength of 600 to 700 nm. The light having a wavelength of 380 nm or less is ultraviolet light. As a result of the ultraviolet light decreasing, the organic EL element is unlikely to adversely affect a human body.

It is preferable that the spectrum of light emitted from the organic EL element show that the quantity of light having a wavelength of 780 nm or more is 0.01 or fewer times the quantity of light having a wavelength of 600 to 700 nm. The light having a wavelength of 780 nm or more is infrared light. As a result of the infrared light decreasing, the organic EL element is unlikely to adversely affect a human body. This is because infrared light is absorbed by skin and thermally damages a human body. Note that the actual candlelight includes a large quantity of infrared light. However, the organic EL element may emit light having a luminescent color imitating a candlelight color, with infrared light in a small quantity. Therefore, light emission that is unlikely to adversely affect a human body and is excellent in lighting can be effectively obtained.

It is preferable that the spectrum of light emitted from the organic EL element should have a spectral peak in a wavelength region having wavelengths of 600 to 700 nm. Accordingly, the amount of red components increases, and the luminescent color can be closer to the candlelight color. It is more preferable that the spectrum have the maximum spectral peak in a wavelength region having wavelengths of 600 to 700 nm. Also, the spectrum may have a spectral peak in a wavelength region having wavelengths of 500 to 600 nm. As a result of the luminescent color containing the green component, lighting properties can be improved.

It is preferable that the luminescent color of the organic EL element be a candlelight-like color. The candlelight is likely to have a calming effect on human. The color of candlelight is likely to have a color temperature of 2500 K or less. However, it is not easy to use the candle as a lighting device in modern times. Also, candlelight includes a large quantity of infrared light, and therefore if the candlelight is reproduced as-is, the candlelight is likely to adversely affect a human body. The organic EL element can emit light having a color similar to the candle color safely. The organic EL element can provide a candlelight-like color imitating a candlelight color efficiently. The candlelight-like color means that in human perception, the color of light emitted from the organic EL element is similar to the color of candlelight. The light spectrum of the organic EL element may be different from the light spectrum of a candle. The organic EL element can provide light that has a color similar to the color of candlelight and includes infrared light in small quantity.

The organic EL element is more advantageous than an inorganic LED because a luminescent color having a calming effect on human can be efficiently obtained. Usually, the inorganic LED contains a large amount of a blue component.

Therefore, even if the color temperature of a luminescent color is reduced through mixing colors or converting wavelengths, melatonin secretion is suppressed due to the blue component in the luminescent color. On the other hand, the organic EL element can provide light emission containing a small amount of the blue component easily. If the amount of the blue component is reduced, the properties of suppressing melatonin secretion decrease. Also, the organic EL element can emit light including a small quantity of ultraviolet light. The organic EL element can emit light having a luminescent color that has positive effects on a human body, psychologically and physically.

In the case where the color temperature of the luminescent color of the organic EL element is 2500 K or less, the number of light-emitting units is preferably three to seven. Accordingly, the color rendering properties expressed by Ra and R9 can increase. Also, if the number of light-emitting units is seven or less, practicality further increases.

Table 4 shows evaluation results of organic EL elements in which the color temperature of a luminescent color is 2500 K or less. Element Examples P1 to P5 have configurations in which a light-emitting unit 1 is added between the third light-emitting unit 1c and the light transmissive electrode 2 in the case where the number of light-emitting units 1 increases, based on the organic EL element having the layer configuration of FIG. 2. The total number of light-emitting units 1 is three in Element Example P1. The total number of light-emitting units is four in Element Example P2, five in Element Example P3, six in Element Example P4, and seven in Element Example P5. In each of the organic EL elements of Element Examples P1 to P5, a light-emitting unit 1, located the closest to the light transmissive electrode 2, of the at least three light-emitting units 1 is the fluorescent unit containing the blue light-emitting material. In each of the organic EL elements of Element Examples P1 to P5, all of the light-emitting units 1 other than the light-emitting unit 1, located the closest to the light transmissive electrode 2, of the at least three light-emitting units 1 are phosphorescent units including the light-emitting layer that contains the red light-emitting material and the light-emitting layer that contains the green light-emitting material.

It is found from Table 4 that the color temperature has a tendency to decrease as the number of light-emitting units 1 increases. Also, as the color temperature decreases, the luminous efficiency increases. The organic EL elements shown in Table 4 have high Ra and R9 that indicate color rendering properties. Therefore, light can have good luminous efficiency and high color rendering properties, and be excellent in lighting properties.

[Interference Design 1]

In the organic EL element, the thickness of a light-emitting layer is several hundred nm, which is relatively thin, and is very similar to the wavelength (medium transmitting wavelength) of light, and therefore thin-film interference occurs inside the organic EL element. As a result, internal light emission interference occurs in accordance with the thickness of an organic layer, and the intensity of light emitted significantly increases and decreases. In order to maximally increase the intensity of light emitted, the organic EL element is configured such that light that directly travels from the light-emitting layer toward the light extraction side interferes constructively with light that travels from the light-emitting layer toward a light reflective electrode, is reflected by this electrode, and then travels toward the light extraction side (reflected light). Light that is reflected by the reflection layer has a phase shift π. In view of this, the ideal model is designed such that an optical film thickness (optical distance) derived by multiplying a film thickness d between a light emission source and the surface of the reflection layer by a refractive index n is substantially equal to an odd multiple of ¼π of the wavelength λ of light. Accordingly, the component quantity of light emitted through the substrate in the front direction is at a local maximum. This design is called cavity design. This method does not mean that light is amplified internally, but means that the direction of light is changed, and intensified in a specific direction, that is, in the front direction in which light is easily extracted to the atmosphere, for example. However, actually, the phase shift of light is not π, refraction and extinction in the organic layer and the reflection layer occur, and accordingly light exhibits more complicated behavior. The phase shift of light at this time may be expressed by φ. The organic EL element can be designed with this phase shift φ.

A phase shift φ ($\lambda_S$) at the weighted average emission wavelength $\lambda_S$ is expressed by Equation (4) below.

[Mathematical 3]

$$\phi(\lambda_S) = \tan^{-1}\left\{\frac{2(n_1 k_2 - n_1 k_2)}{n_1^2 - n_2^2 + k_1^2 - k_2^2}\right\} \quad (4)$$

In this equation, $n_1$ and $k_1$ respectively express the refractive index and extinction coefficient of a layer that is in contact with the light reflection layer, $n_2$ and $k_2$ respectively express the refractive index and extinction coefficient of the light reflection layer, and $n_1$, $n_2$, $k_1$, and $k_2$ are functions of

TABLE 4

| | Total number of light-emitting units | Number of phosphorescent units (red + green) | Number of fluorescent units (blue) | Color coordinates (x, y) | Color temp. (K) | Ra | R9 | Light emission efficiency (lm/W) |
|---|---|---|---|---|---|---|---|---|
| Element Ex. P1 | 3 | 2 | 1 | (0.52, 0.42) | 2130 | 91 | 61 | 72 |
| Element Ex. P2 | 4 | 3 | 1 | (0.54, 0.42) | 1950 | 93 | 46 | 75 |
| Element Ex. P3 | 5 | 4 | 1 | (0.55, 0.41) | 1870 | 92 | 38 | 77 |
| Element Ex. P4 | 6 | 5 | 1 | (0.56, 0.41) | 1830 | 91 | 34 | 79 |
| Element Ex. P5 | 7 | 6 | 1 | (0.56, 0.41) | 1800 | 90 | 31 | 80 |

$\lambda_S$. In the organic EL elements of FIGS. 1 and 2, the light reflective electrode 3 serves as the light reflection layer.

Cavity conditions are considered with this phase shift $\phi(\lambda_S)$ to more intensify interference in the light-emitting layer 5 of an Lth light-emitting unit 1 from the light reflective electrode 3. Positions at odd multiples of $\frac{1}{4}\pi$ of the wavelength $\lambda$ of light are favorable under cavity conditions. Therefore, theoretically ideal positions for the cavity effect can be expressed by the following equation with the weighted average emission wavelength $\lambda_S$.

[Mathematical 4] (5)
$$D_L(\lambda_S) = \phi(\lambda_S) \times \frac{\lambda_S}{4\pi} + 0.5(m-1) \times \lambda_S$$

$$D_L(\lambda_S) = n(\lambda_S) \times d_L \quad (6)$$

In the above equation, m is an integer that is greater than or equal to 1. $n(\lambda_S)$ indicates, when a wavelength is $\lambda_S$, an average refractive index of a medium that is disposed between the light reflective electrode 3 and the light-emitting layer 5. $d_L$ is the distance between the light reflective electrode 3 and the light-emitting layer 5. This distance expresses a physical distance. Note that it can be said that a distance obtained by multiplying the refractive index by the physical distance, that is, Equation (6) above expresses the optical distance. Also, it can be said that m indicates the degree of cavity.

Hence, the average refractive index of media in the layers constituting the organic EL element is obtained by Equation (7) below.

[Mathematical 5] (7)
$$\tilde{n}(\lambda) = \frac{\sum n_1(\lambda) \times d_1 + n_2(\lambda) \times d_2 + \cdots}{\sum d_m}$$

In the above equation, d indicates the thickness of an individual layer constituting a medium, and n indicates the refractive index of an individual layer constituting a medium, m is an integer that is greater than or equal to 1, and indicates the number assigned in order to layers. In other words, d, n, and m in this equation are not related to the other equations.

As can be understood from the above equation, the average refractive index of media may be the average value of refractive indexes of media in the weighted average emission wavelength $\lambda_S$ of the spectrum of a light-emitting material. In other words, the average refractive index is the average value of refractive indexes weighted with the thickness.

The organic EL element can be designed based on the distance between a light emission position and the light reflective electrode 3 in view of the principle of interference. An emission spectrum of the light-emitting layer 5 has a width to some extent, and therefore it is preferable that the degree of cavity, that is, the degree of interference, be small as much as possible. If the degree of cavity increases, a difference in spectrum between a short wavelength and a long wavelength is likely to increase, and it may be difficult to obtain enhancement effects of interference, and efficiency and viewing angle characteristics may decrease as a result.

Also, a light path length changes in accordance with the viewing angle, that is, the angle of light travelling. Therefore, it is preferable to perform cavity design in view of these facts. Specifically, it is preferable to modify Equation (5) above, which is the cavity condition for light that travels toward the front.

In the organic EL element, all of the light-emitting layers 5 preferably satisfy the second-order cavity condition. This is because the light-emitting layers 5 in a cavity having a lower degree can increase light extraction properties. In addition, in view of the light in the oblique direction, it is preferable that the cavity design should deviate from a preferred cavity design in the front direction. At this time, considering light interference in the oblique direction, it is preferable that the coefficient 0.5 in front of $\lambda_S$ in Equation (5) above should deviate within a range of about 0.25. Therefore, it is preferable that the distance $d_F$ satisfy the conditions of Equations (2) and (3) below, the distance $d_F$ being between the light-emitting layer 5 of a light-emitting unit 1, located the farthest from the light reflective electrode 3, of the at least three light-emitting units 1 and the light reflective electrode 3. Accordingly, all of the light-emitting layers 5 are accommodated in the second-order cavity, and the effect of strengthening light due to interference increases, and therefore

[Mathematical 6] (2)
$$D_F(\lambda_S) < \phi(\lambda_S) \times \frac{\lambda_S}{4\pi} + 0.75 \times \lambda_S$$

$$D_F(\lambda_S) = n(\lambda_S) \times d_F \quad (3)$$

In Expression (2) above, $\phi(\lambda_S)$ indicates a phase shift that occurs in the light reflective electrode 3. In Equation (3) above, $n(\lambda_S)$ indicates, when a wavelength is $\lambda_S$, the average refractive index of a medium that is disposed between the light reflective electrode 3 and the light-emitting layer 5. $\phi(\lambda_S)$ and $n(\lambda_S)$ in these equations indicate values at the weighted average emission wavelength $\lambda_S$.

As described above, it is preferable that the distance $d_F$ satisfy the conditions of Equations (2) and (3), the distance $d_F$ being between the light reflective electrode 3 and the light-emitting layer 5 of the light-emitting unit 1, located the farthest from the light reflective electrode 3, of the at least three light-emitting units 1. Accordingly, the light-emitting layer 5 located the farthest from the light reflective electrode 3 can be disposed nearer to the light reflective electrode 3, and therefore light extraction properties can be further improved.

Hence, when a distance d between the light-emitting layer 5 and the light reflective electrode 3 is considered, in this specification, unless otherwise stated, the central position of the light-emitting layer 5 in the thickness direction is used as a reference for the light-emitting layer 5, and the surface on the light-emitting layer 5 side is used as a reference for the light reflective electrode 3. In the case where the light-emitting layer 5 is constituted by a plurality of layers, the center of the light-emitting layer 5 in the thickness direction having a plurality of layers is used as a reference. In other words, more accurately speaking, it can be said that the distance d is a distance between the surface of the light reflective electrode 3 on the light-emitting layer 5 side and the middle of the light-emitting layer 5 in the thickness direction. The reason why the surface of the light reflective electrode 3 is used as a reference would be understood from the fact that the surface of the reflection layer reflects light. On the other hand, strictly speaking, with regard to the light-emitting layer 5, although an emission center that is the recombination point for electrons and holes is preferably used as the reference, the recombination point may change in accordance with the material or properties of the element, and the percentage of the thickness of the light-emitting layer 5 is often small with respect to the entire thickness, and therefore the middle of the light-emitting layer 5 may be used as the reference position. Of course, in the case where the emission center can be found, the emission center may be used as the reference for the distance d. For example, there is a possibility that the emission center is on the surface (the surface on the light reflective electrode 3 or the surface on the light transmissive electrode 2 side), a layer interface (a boundary surface between layers constituting the light-emitting layer 5 having a plurality of layers), or the like, instead of the middle of the layer in the thickness direction.

In the organic EL element, the light-emitting unit 1, located the closest to the light reflective electrode 3, of the at least three light-emitting units 1 is preferably the short-wavelength light-emitting unit 1S. Because light having a short wavelength is likely to be affected by interference, by disposing the short-wavelength light-emitting unit 1S near the light reflection layer, more light can be emitted from the short-wavelength light-emitting unit 1S. Therefore, the light extraction properties can be improved. Also, in the case where the light reflective electrode 3 serves as the cathode, the short-wavelength light-emitting unit 1S serves as the light-emitting unit 1 located the closest to the cathode, and therefore electron injection capabilities can be improved. Therefore, it is possible to obtain an element that is driven with a lower voltage.

In a preferable aspect, the at least three light-emitting units 1 include a light-emitting unit 1 containing the green light-emitting material, a light-emitting unit 1 containing the blue light-emitting material, and a light-emitting unit 1 containing the red light-emitting material, which are disposed in this order starting from the side of the light reflective electrode 3. Accordingly, such an arrangement is more suitable for light emitted from the light-emitting units, and therefore light extraction properties can be further improved. This is because the arrangement in which a material having a short wavelength is provided near the light reflective electrode 3 makes it easy to set preferred conditions for interference. Also, it is easy to accommodate the three light-emitting layers 5 within the second-order cavity, and therefore light extraction efficiency can be improved easily.

In another preferable aspect, the at least three light-emitting units 1 include a light-emitting unit 1 containing the blue light-emitting material, a light-emitting unit 1 containing the red light-emitting material, and a light-emitting unit 1 containing the green light-emitting material, which are disposed in this order starting from the side of the light reflective electrode 3. Accordingly, such an arrangement is more suitable for light emitted from the light-emitting units, and therefore the light extraction properties can be further improved. This is because the arrangement in which a material having a short wavelength is provided near the light reflective electrode 3 makes it easy to set preferred conditions for interference. Also, it is easy to accommodate the three light-emitting layers 5 within the second-order cavity, and therefore light extraction efficiency can be improved easily.

The reason why the above-described relationships are favorable will be described.

An Element Example 2A was produced based on Element Example 2-2 described above. Also, Element Examples 3 and 4 were produced by modifying the configuration of the light-emitting unit 1 of Element Example 2.

Table 5 shows an overview of the element configuration.

TABLE 5

| | First light-emitting unit | | Second light-emitting unit | | Third light-emitting unit | |
|---|---|---|---|---|---|---|
| | Light emitting material | Cavity | Light emitting material | Cavity | Light emitting material | Cavity |
| Element Ex. 2A | red + green (long wavelength) | phosphorescent first-order | red + green (long wavelength) | phosphorescent second-order | blue (short wavelength) | fluorescent third-order |
| Element Ex. 3 | red + green (long wavelength) | phosphorescent first-order | blue (short wavelength) | phosphorescent second-order | red + green (long wavelength) | phosphorescent second-order |
| Element Ex. 4 | blue (short wavelength) | fluorescent first-order | red + green (long wavelength) | phosphorescent first-order | red + green (long wavelength) | phosphorescent second-order |

In order to improve light extraction properties due to interference, in Element Example 2A, the first light-emitting layer 5a was disposed near the first-order cavity, the second light-emitting layer 5b was disposed near the second-order cavity, and the third light-emitting layer 5c was disposed near the third-order cavity. In Element Example 3, the first light-emitting layer 5a was disposed near the first-order cavity, the second light-emitting layer 5b was disposed near the second-order cavity, and the third light-emitting layer 5c was disposed near the second-order cavity. In Element Example 4, the first light-emitting layer 5a was disposed near a first-order cavity, the second light-emitting layer 5b was disposed near a first-order cavity, and the third light-emitting layer 5c was disposed near a second-order cavity. In Element Examples 3 and 4, the relationships of Equation (2) and Equation (3) described above are satisfied.

Hence, the organic EL element having a multi-unit structure includes a plurality of light-emitting layers 5, and therefore viewing angle characteristics (suppression of chromaticity deviation) are important, in particular. The viewing angle characteristics of the organic EL element are expressed with the color difference ($\Delta u'v'$). This $\Delta u'v'$ refers to the maximum value of root-mean-squares ($\Delta u'^2 + \Delta v'^2$)$^\wedge$(½) of the amounts by which the u'v' coordinates of chromaticity deviates from the average value in the range of a viewing angle of 80 degrees from the front. Hence, "$^\wedge$" is a sign indicating a multiplier. According to the standards of Energy Star (Program Requirements for Solid State Lighting Luminaires, Eligibility Criteria-Version 1.1, 2008), satisfying $\Delta u'v' < 0.007$ is preferable for lighting quality. However, this $\Delta u'v'$ range indicates the value of the entire element in the case where the organic EL element includes the light diffusion layer 7 and the like. In a simplified system, the Δu'v' range is preferably as low as possible. In view of this, the viewing angle characteristics were also evaluated.

Table 6 shows the result on comparing the characteristics of Element Examples 2A, 3, and 4. It was confirmed from Table 6 that the Element Examples 3 and 4 that were designed such that the third light-emitting unit 1c was disposed near the second-order cavity had more increased efficiency and viewing angle characteristics than Element Example 2A that was designed such that the third light-emitting unit 1c, which is located the farthest from the light reflective electrode 3, was disposed near the third-order cavity. Element Example 3 includes the light-emitting unit 1 containing the green light-emitting material, the light-emitting unit 1 containing the blue light-emitting material, and the light-emitting unit 1 containing the red light-emitting material, which are disposed in this order starting from the side of the light reflective electrode 3, and it was confirmed that Element Example 3 had excellent efficiency and viewing angle characteristics. In Element Example 3, the first light-emitting unit 1a contains the green light-emitting material as a main component, and the third light-emitting unit 1c contains the red light-emitting material as the main component. Also, Element Example 4 includes the light-emitting unit 1 containing the blue light-emitting material as the first light-emitting unit 1a, and it was confirmed that the intensity of light having a short wavelength increased and a luminescent color having a relatively high color temperature was obtained, compared to the other element examples. In Element Example 4, the second light-emitting unit 1b contains the red light-emitting material as a main component, and the third light-emitting unit 1c contains the green light-emitting material as the main component.

FIG. 5 shows, as a graph, the relationship between the wavelength $\lambda_S$ and the distance $d_F$ in the light-emitting layer 5 (the third light-emitting layer 5c) of the light-emitting unit 1, located the farthest from the light reflective electrode 3, of the light-emitting units 1. In this graph, the relationship between the wavelength $\lambda_S$ and the critical value of the distance $d_F$ ("<" is substituted with "=" in Equation 8 above) is shown. It can be understood from the graph that as the wavelength $\lambda_S$ increases, the distance $d_F$ can be increased. Therefore, it can be understood that it is preferable that a light-emitting unit 1, located the farthest from the light reflective electrode 3, of the light-emitting units 1 should not contain the blue light-emitting material having a short wavelength. Hence, a preferable value of the distance $d_F$ may change in accordance with the material of the light reflective electrode 3, or the refractive index of an organic material. In this example, the light reflective electrode 3 (cathode) is made of Ag. Although the refractive index of a medium differs in accordance with the wavelength, it is set to approximately 1.8 to 1.9. Even if consideration is given to these matters, the influence that these matters have on the light extraction properties is less than that of the setting of the distance $d_F$, and therefore as a result of the relationship of Equation (8) being satisfied, the light extraction properties can be improved. The relationship expressed by this graph can be utilized for the arrangement of the light-emitting layer 5 of the light-emitting unit 1 located the farthest from the light reflective electrode 3.

The above-described organic EL element is designed in view of an optical interference effect based on the light in the oblique direction. Therefore, light emerging to the outside can be efficiently increased. Also, because of design based on the light in the oblique direction, it is possible to suppress

TABLE 6

| | First light-emitting unit | | Second light-emitting unit | | Third light-emitting unit | | | Viewing angle | Color |
|---|---|---|---|---|---|---|---|---|---|
| | wavelength $\lambda_S$ (nm) | distance d (nm) | wavelength $\lambda_S$ (nm) | distance d (nm) | wavelength $\lambda_S$ (nm) | distance d (nm) | Efficiency (lm/W) | characteristics Δu'v' | Temp. (K) |
| Element Ex. 2A | 610 | 70 | 610 | 230 | 480 | 320 | 36 | 0.015 | 2800 |
| Element Ex. 3 | 590 | 65 | 480 | 180 | 640 | 260 | 40 | 0.010 | 2900 |
| Element Ex. 4 | 480 | 40 | 640 | 80 | 590 | 240 | 39 | 0.013 | 3000 |

From Equations (2) and (3), a relational equation of a distance $d_F$, which is suitable for the light-emitting layer 5 of the light-emitting unit 1 located the farthest from the light reflective electrode 3, can be expressed as Equation (8).

[Mathematical 7] (8)

$$d_F = \frac{D_F(\lambda_S)}{n(\lambda_S)} < \frac{1}{n(\lambda_S)}\left[\phi(\lambda_S) \times \frac{\lambda_S}{4\pi} + 0.75 \times \lambda_S\right]$$

Based on this relational equation, it can be said that the preferable condition for the distance $d_F$ is the function of the wavelength $\lambda_S$. In the organic EL element, it is possible to optimize the position of the light-emitting layer 5 of the light-emitting unit 1 located the farthest from the light reflective electrode 3 with the above-described relational equation.

a difference in color in accordance with the viewing angle. As a result, it is possible to obtain the organic EL element that has high light extraction efficiency and excellent emission characteristics, and in which the viewing angle dependence is suppressed.

[Interference Design 2]

A more preferable relationship in light extraction design for the organic EL element will be described.

In the organic EL element, as described above, the light path length changes in accordance with the angle of light travelling, and therefore interference can be designed based on deviation from cavity design in the front direction.

Hence, a factor a is introduced as the index for expressing deviation from the cavity design in the front direction. An equation for the cavity design with the factor a can be expressed by Equations (9) and (10) below, with modification of Equation (5).

[Mathematical 8]

$$D_L(\lambda_S) = \phi(\lambda_S) \times \frac{\lambda_S}{4\pi} + [0.5(m-1) + a_L] \times \lambda_S \quad (9)$$

$$D_L(\lambda_S) = n(\lambda_S) \times d_L \quad (10)$$

In the above equation, m is an integer that is greater than or equal to 1. n($\lambda_S$) indicates, when a wavelength is $\lambda_S$, the average refractive index of a medium that is disposed between the light reflective electrode 3 and the light-emitting layer 5 of an Lth light-emitting unit 1 from the light reflective electrode 3. $d_L$ is the distance between the light reflective electrode 3 and the light-emitting layer 5 of the Lth light-emitting unit 1 from the light reflective electrode 3. In the above equation, in order to express the factor a of the light-emitting layer 5 of the Lth light-emitting unit 1 from the light reflective electrode 3, this factor a is expressed as $a_L$. m is a numerical value expressing the degree of a cavity. For example, in the first-order cavity, m is equal to 1. In the second-order cavity, m is equal to 2.

By introducing the factor a, the light extraction properties can be effectively improved. Note that it may be said that Equation (2) above is an equation derived by substituting 0.25 for a and 2 for m in Equation (9).

The factor a will be described. The factor a described below may be applied to the factor $a_L$ of an Lth light-emitting unit 1. The factor a of the first light-emitting unit 1a is expressed as $a_1$. The factor a of the second light-emitting unit 1b is expressed as $a_2$. The factor a of the third light-emitting unit 1c is expressed as $a_3$.

Usually, the factor a may be expressed as a value of 0 or more and 0.5 or less. In other words, the factor a has a relationship where 0≤a≤0.5. This is because the condition that the factor a is 0.5 or more is for the design of the cavity having the next degree. In other words, cavity design is considered through incrementing the number of m by one.

With regard to the factor a, if a=0 is satisfied, the cavity suitable for in the front direction is achieved. Therefore, in view of the light in the oblique direction, a is preferably different from 0, and in order that more light in the oblique direction is extracted, it is more preferable that a satisfy the condition of a>0. The factor a may be set to 0.01 or more, and more preferably set to 0.03 or more, for example. This condition is obtained by modifying the optimal cavity condition in the front direction, based on the fact that the peak of the quantity of light is at 45 degrees. By slightly changing the front cavity design in view of light in the oblique direction in this manner, light extraction design is gotten based on not only the front direction but also the oblique direction, as a result of which light extraction efficiency can be increased. However, if the factor a excessively deviates from the cavity design, there is a risk that deviation of the cavity will increase excessively and the effect of increasing the light extraction properties will decrease. Therefore, the factor a is preferably a≤0.25, and more preferably a≤0.2. Alternatively, in view of the cavity having a degree that is larger by one, the factor a is preferably a≥0.35, and more preferably a≥0.4.

The cavity design with the factor a can be useful to increase the color rendering property of the organic EL element. In particular, in the case where the light-emitting units 1 include at least two or more light-emitting units 1 containing the same light-emitting material, it is possible to perform design with the factor a. In Element Example 2 that was produced above, the green light-emitting material of the first light-emitting unit 1a and the green light-emitting material of the second light-emitting unit 1b are the same green light-emitting material. Also, in Element Example 2, the red light-emitting material of the first light-emitting unit 1a and the red light-emitting material of the second light-emitting unit $1_b$ are the same red light-emitting material. Therefore, an increase in color rendering property can be achieved with the factor a. Hereinafter, designing the color rendering property will be described.

A factor a of the first light-emitting unit 1a that is a light-emitting unit 1, located the closest to the light reflective electrode 3, of the light-emitting units 1, and a factor a of the second light-emitting unit 1b that is disposed next to the first light-emitting unit 1a will be considered. Although the relationship between the first light-emitting unit 1a and the second light-emitting unit 1b will be described hereinafter, the same can be applied to the relationship between the first light-emitting unit 1a and the third light-emitting unit 1c and/or the relationship between the second light-emitting unit 1b and the third light-emitting unit 1c. Hereinafter, the first light-emitting unit 1a utilizes the first-order cavity, and the second light-emitting unit 1b utilizes the second-order cavity.

With regard to the light-emitting layer 5 of the first light-emitting unit 1a, the equation for cavity design with the factor a may be indicated by Equations (11) and (12) below.

[Mathematical 9]

$$D_1(\lambda_S) = \phi(\lambda_S) \times \frac{\lambda_S}{4\pi} + a_1 \times \lambda_S \quad (11)$$

$$D_1(\lambda_S) = n(\lambda_S) \times d_1 \quad (12)$$

In the equation above, n($\lambda_S$) indicates, when a wavelength is $\lambda_S$, the average refractive index of the medium that is disposed between the light reflective electrode 3 and the light-emitting layer 5 of the first light-emitting unit 1a from the light reflective electrode 3. $d_1$ is the distance between the light reflective electrode 3 and the light-emitting layer 5 of the first light-emitting unit 1a from the light reflective electrode 3. $a_1$ is the factor a of the light-emitting layer 5 of the first light-emitting unit 1a.

With regard to the light-emitting layer 5 of the second light-emitting unit 1b, the equation for cavity design with the factor a may be indicated by Equations (13) and (14) below.

[Mathematical 10]

$$D_2(\lambda_S) = \phi(\lambda_S) \times \frac{\lambda_S}{4\pi} + (0.5 + a_2) \times \lambda_S \quad (13)$$

$$D_2(\lambda_S) = n(\lambda_S) \times d_2 \quad (14)$$

In the equation above, n($\lambda_S$) indicates, when a wavelength is $\lambda_S$, the average refractive index of the medium that is disposed between the light reflective electrode 3 and the light-emitting layer 5 of the second light-emitting unit 1b from the light reflective electrode 3. $d_2$ is the distance between the light reflective electrode 3 and the light-emitting layer 5 of the second light-emitting unit 1b from the light reflective electrode 3. $a_2$ is the factor a of the light-emitting layer 5 of the second light-emitting unit 1b.

In this case, it is preferable that the factor a be slightly different in value in the at least three light-emitting units 1 containing the same light-emitting material. If the factor a is slightly different in value, the interference condition changes, and the emission spectrum of light that is extracted will be slightly different. Then, trough of the wavelength of light emerging to the outside can be filled as a whole, and therefore the color rendering properties can be improved.

Deviation of the factor a may be expressed as the absolute value $|\Delta a|$ of a difference in factor a. With regard to the first light-emitting unit $1a$ and the second light-emitting unit $1b$, $\Delta a$ equals $a_2-a_1$. In this case, preferably, the relationship of Equation (15) below is satisfied.

[Mathematical 11]

$$|a_2-a_1| \geq 0.05 \quad (15)$$

By satisfying the above-described relational equation, the wavelength of the light emitted from the first light-emitting unit $1a$ and the wavelength of the light emitted from the second light-emitting unit $1b$ interfere with each other to fill troughs of the spectrum, and therefore the color rendering property can be effectively improved. In other words, the peak of the spectrum in which the intensity of the light-emitting material has been increased due to interference slightly shifts depending on the light-emitting unit $1$. Therefore, a design is achieved in which the trough of the wavelength is filled as the entire emission spectrum. As a result, trough of an emission spectrum can become smaller, and light emission having a high color rendering property can be obtained.

Hence, it is even more preferable that the weighted average emission wavelength $\lambda_S$ of the first light-emitting unit $1a$ and the weighted average emission wavelength $\lambda_S$ of the second light-emitting unit $1b$ be the same wavelength ($\lambda_O$, for example). Accordingly, the effect of the color rendering property can be further improved. Note that the weighted average emission wavelength $\lambda_S$ of the light-emitting unit $1$ is obtained in case of a single unit, and the wavelength of light that is actually extracted may be different therefrom.

With regard to the difference between factors a, both factors a preferably satisfy $0 \leq a \leq 0.2$. In other words, in the relationship between the first light-emitting unit $1a$ and the second light-emitting unit $1b$, $0 \leq a_1 \leq 0.2$ and $0 \leq a_2 \leq 0.2$ are satisfied. Accordingly, the color rendering property can be further efficiently improved. Also, in view of the difference between factors a, both factors a preferably satisfy $0.45 \leq a \leq 0.5$. In other words, in the relationship between the first light-emitting unit $1a$ and the second light-emitting unit $1b$, $0.4 \leq a_1 \leq 0.5$ and $0.4 \leq a_2 \leq 0.5$ are satisfied. Accordingly, the color rendering property can be more efficiently improved.

The absolute value $|\Delta a|$ of the difference between factors a is more preferably 0.15 or less. Accordingly, the color rendering property can be further efficiently improved while improving the light extraction properties.

The light-emitting material, which is the same in the two or more light-emitting units $1$, may be any one of the red light-emitting material, the green light-emitting material, and the blue light-emitting material. In a preferable aspect, the light-emitting material, which is the same in the two or more light-emitting units $1$, is the green light-emitting material. A green color has a high visibility, and therefore the light emission properties in a high visibility region are increased, as a result of which the overall color rendering properties can be improved. In a preferable aspect, the light-emitting material, which is the same light-emitting material in the two or more light-emitting units $1$, is the red light-emitting material. A red color significantly affects the color rendering property, and therefore the light emission properties in a region where the color rendering property has a great influence are increased, as a result of which the overall color rendering properties can be improved. Preferably, two or more light-emitting units $1$ containing the same red light-emitting material and the same green light-emitting material are provided. Accordingly, the color rendering property can be further improved. Furthermore, more preferably, the weighted average emission wavelengths of the light-emitting units $1$ are the same.

The reason why the above-described relationship is preferable will be further described.

Element Examples 5-1, 5-2, and 5-3 were produced through modifying the distance between the light reflective electrode $3$ (cathode) and the light-emitting layer $5$, based on Element Example 2A. In Element Examples 5-1, 5-2, and 5-3, the positions of the third light-emitting layers $5c$ thereof were same, and the positions of the first light-emitting layers $5a$ and the second light-emitting layers $5b$ were adjusted. These element examples were designed in view of conditions to strengthen light by interference. Adjustment was performed with this method such that the trough in the spectrum further become smaller, and the average color rendering index Ra, which is the index for the color rendering property in the organic EL element, was evaluated.

Table 7 shows the result of evaluation of Element Examples 2A, 5-1, 5-2, and 5-3.

TABLE 7

| | First light-emitting unit long wavelength (red + green) | | | Second light-emitting unit long wavelength (red + green) | | | Third light-emitting unit short wavelength (blue) | | | | |
|---|---|---|---|---|---|---|---|---|---|---|---|---|
| | wavelength $\lambda_S$ (nm) | distance d (nm) | factor $a_1$ | wavelength $\lambda_S$ (nm) | distance d (nm) | factor $a_2$ | wavelength $\lambda_S$ (nm) | distance d (nm) | $\Delta a$ $|a_2 - a_1|$ | Efficiency (lm/W) | Ra |
| Element Ex. 2A | 610 | 70 | 0.05 | 610 | 230 | 0.03 | 480 | 320 | 0.02 | 36 | 82 |
| Element Ex. 5-1 | 610 | 70 | 0.05 | 610 | 280 | 0.18 | 480 | 320 | 0.13 | 34 | 90 |
| Element Ex. 5-2 | 610 | 90 | 0.10 | 610 | 260 | 0.11 | 480 | 320 | 0.01 | 32 | 81 |
| Element Ex. 5-3 | 610 | 90 | 0.10 | 610 | 230 | 0.03 | 480 | 320 | 0.07 | 35 | 87 |

As shown in Table 7, the absolute value of the difference $(a_2-a_1)$ in factor a is 0.05 or more in Element Examples 5-1 and 5-3, in which the first light-emitting unit $1a$ and the second light-emitting unit $1b$ contain the same light-emitting materials (the red light-emitting material and the green light-emitting material). As a result, it was confirmed that Ra increased due to shifting in peaks and the color rendering property was improved.

Figure 6:
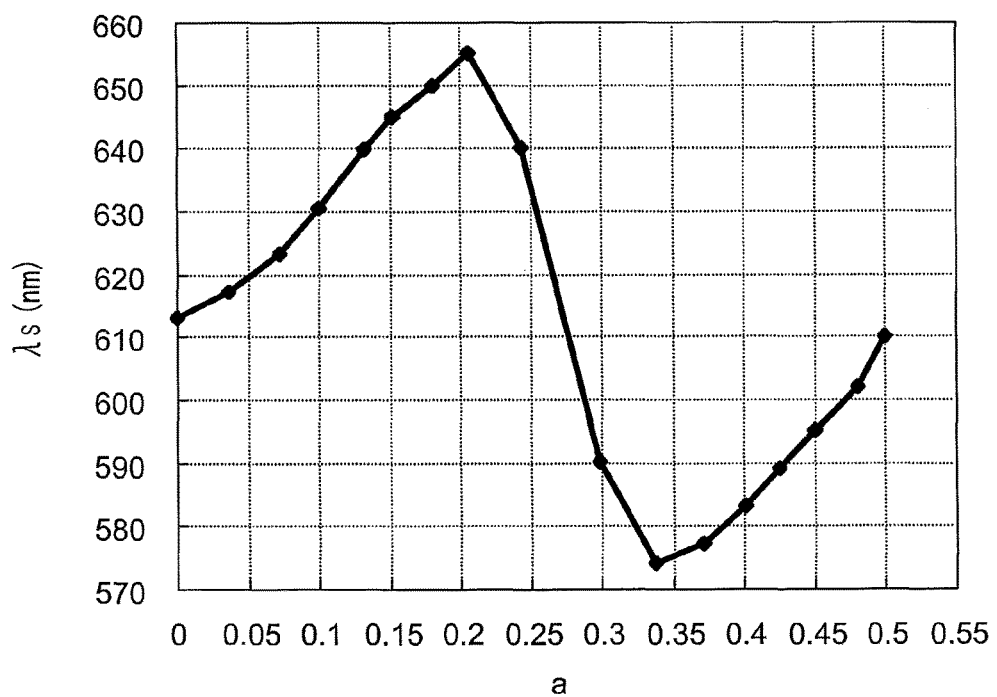
FIG. 6 is a graph showing a relationship between a factor a and a wavelength $\lambda_S$ in a light-emitting unit.

FIG. 6 is a graph showing the relationship between the factor a and the wavelength $\lambda_S$ in the light-emitting unit 1 containing the red light-emitting material and the green light-emitting material. In this graph, the weighted average emission wavelength $\lambda_S$ of the light-emitting unit 1 is obtained without excluding interference. When the factor a is 0.05 or more, the wavelength $\lambda_S$ shifts to the long-wavelength side. In other words, the wavelength of light emerging to the outside becomes high. Therefore, a difference in wavelength $\lambda_S$ can increase, and the color rendering property can be increased more easily. In order to increase the color rendering property, the difference in wavelength is preferably set to 5 nm or more, for example. However, as interference which has periodicity is utilized, the wavelength shifts by a predetermined value or more, the shift leads to the formation of a narrow gap between cavities, as a result of which the effect of improving the color rendering property decreases. Therefore, $\Delta$a is preferably 0.15 or less. Also, the difference in wavelength may be 30 nm or less. Incidentally, in Table 7, the wavelengths $\lambda_S$ in the first light-emitting unit 1a and the second light-emitting unit 1b are 610 nm, which is the same. This is because this wavelength is obtained in a single unit with the interference condition being removed as much as possible. Therefore, in the multi-unit element, the wavelength of light that is actually extracted slightly shifts in accordance with the above-described design.

According to the above, it is found that the difference between factors a in the two or more light-emitting units 1 containing the same light-emitting material is preferably 0.05 or more. By setting the difference between factors a in this manner, shifting in intensity based on interference occurs, the trough of the spectrum can become smaller with the same light-emitting material, and the color rendering property can be efficiently improved.

[Light Extraction Structure]

The above-described organic EL element is configured such that the two or more long-wavelength light-emitting units 1L are greater in number than the one or more short-wavelength light-emitting units 1S, and therefore the component as a whole on the long-wavelength side is relatively greater. Therefore, the component absorbed internally is relatively small, and accordingly the light extraction efficiency increases. This can be understood from the fact that in general, components having a short wavelength are absorbed more by all of the organic material, the material constituting the electrodes, and members constituting the light extraction structure.

Figure 7A:
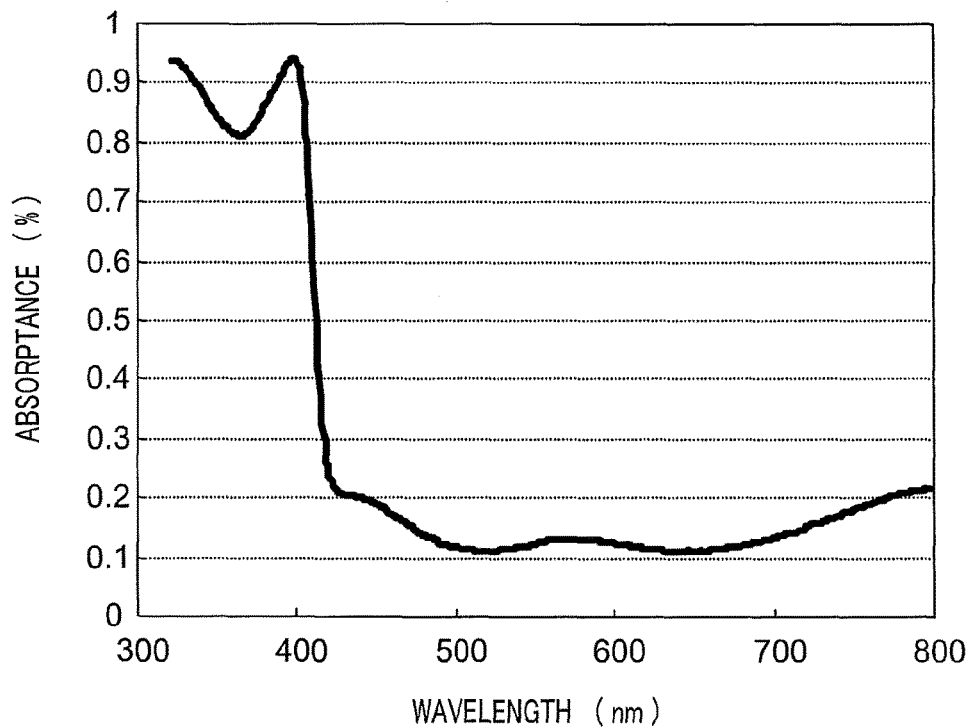
FIG. 7A and FIG. 7B are graphs showing an example of an absorption spectrum of an organic material.
Figure 7B:
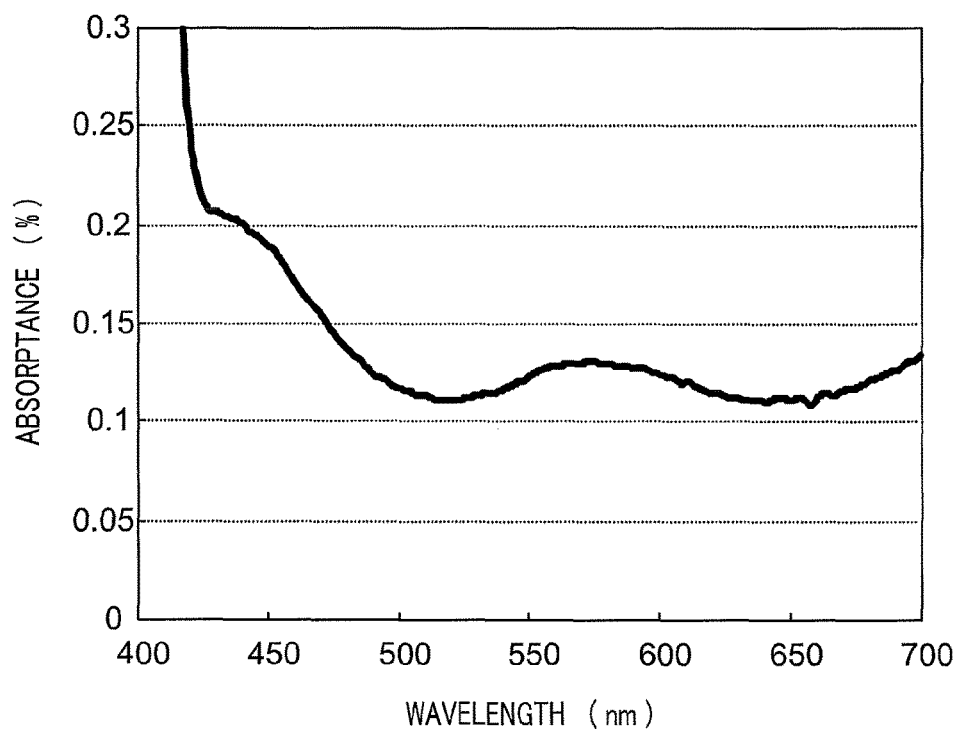

FIG. 7A and FIG. 7B are graphs showing an example of an absorption spectrum of an organic material. FIG. 7A is an overall view and FIG. 7B is an enlarged view. FIG. 7A and FIG. 7B shows the wavelength dependence of absorption spectrum obtained from the transmission and reflection spectra of the organic material of Element Example 2. FIG. 7A is a graph in a wavelength from 300 to 800 nm and FIG. 7B is a graph showing a portion of the graph of FIG. 7A at wavelengths from 400 to 700 nm. It is understood from FIG. 7A and FIG. 7B that there is more absorption in the short-wavelength range. Hence, the dopant of the long-wavelength material has the property of absorbing a small quantity of light having a short wavelength and emitting light having the above-described wavelength. Therefore, if the number of long-wavelength light-emitting units 1L is increased, a relative long-wavelength component increases dramatically, and the light extraction efficiency is further increased.

Figure 8A:
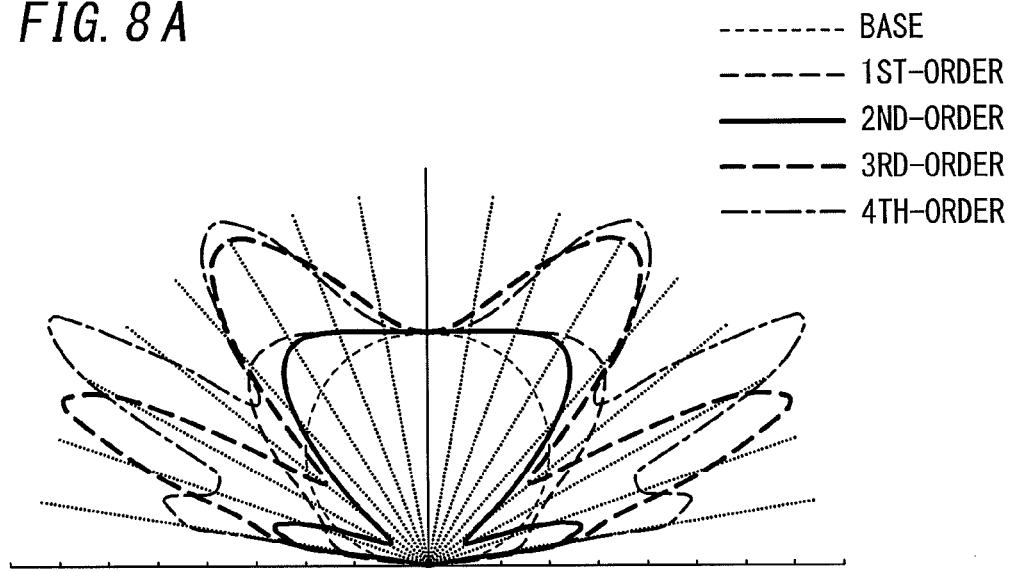
FIG. 8A and FIG. 8B shows an example of a relationship between light emission angles and light quantity distribution.
Figure 8B:
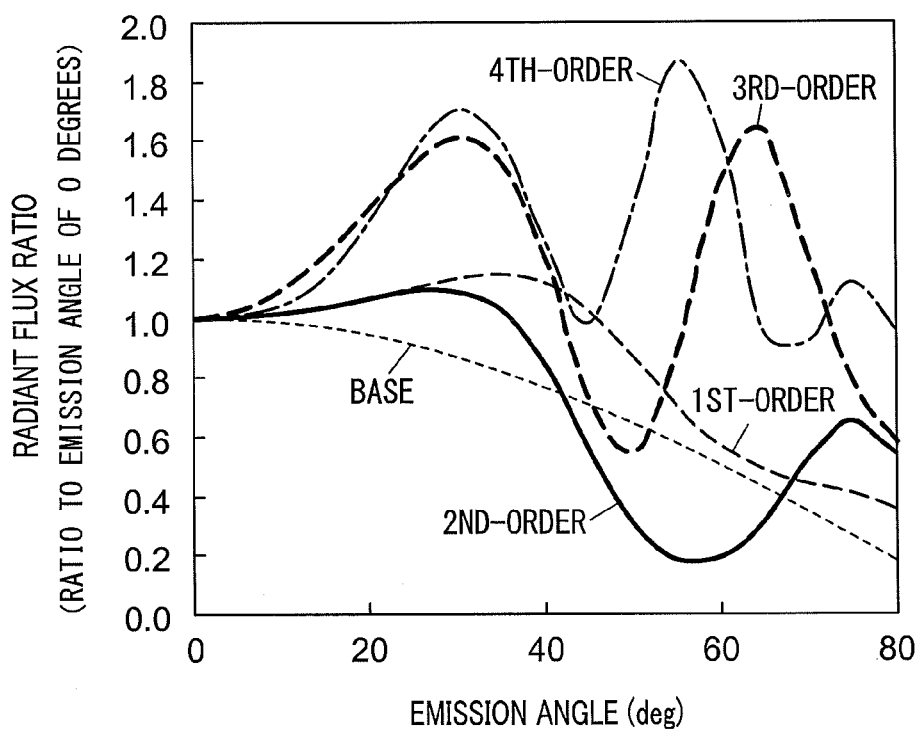

FIG. 8A and FIG. 8B show an example of the relationship between light emission angles and light quantity distribution. FIG. 8A shows a light distribution pattern. FIG. 8B is a graph of radiant flux ratio. In FIG. 8A, the light in the front direction is used as the reference and is drawn in the center, and the quantity of light at an angle is expressed as a distance from the center. In FIG. 8B, the radiant flux ratio is expressed as a graph where the horizontal axis is the emission angle and the vertical axis is the relative quantity of light (radiant flux ratio). In FIG. 8A and FIG. 8B, the base indicates the intensity of light without the interference condition.

As shown in FIG. 8A and FIG. 8B, high-order cavity modes, such as second-order, third-order, and fourth-order cavity modes can increase the component on the wide-angle side having a large incidence angle. In order to extract such components, a light extraction structure is preferably provided because it is unlikely to be affected by a difference in refractive index. In this case, as the organic EL element of FIG. 1, the light extraction structure may be configured by the light diffusion layer 7 provided between the substrate 6 and the light transmissive electrode 2. The light diffusion layer 7 is an internal extraction structure. According to the internal extraction structure, the total reflection at the substrate 6 is suppressed and light can be extracted efficiently. Of course, an external light extraction structure may be provided on the outside of the substrate 6 (the side opposite to the light transmissive electrode 2). The external light extraction structure may be configured by a light scattering film. A more preferable configuration of the light diffusion layer 7 will be described later.

[Material for Organic EL Element]

The material for the organic EL element will be described. The organic EL element may be made of an appropriate material that is usually used to manufacture organic EL elements.

A glass substrate may be used as the substrate 6. Soda-lime glass may be used as glass. Although alkali-free glass may be used, soda-lime glass is generally less expensive and is advantageous in terms of cost. Also, in the case where the light diffusion layer 7 is provided, even if the soda-lime glass is used, the light diffusion layer 7 is present as a ground layer for organic layers, and therefore the influence of alkali diffusion on the light transmissive electrode 2 such as ITO can be suppressed.

The light diffusion layer 7 may be a thin film obtained by applying the material including a base material and scattering particles dispersed in the base material, for example. In this case, the refractive index of the base material for the light diffusion layer 7 is preferably as high as possible, and it is preferable that the refractive index thereof be equivalent to or greater than that of an organic material for an organic EL element. Also, in order to increase the light extraction properties, it is preferable that the material be unlikely to absorb light as much as possible. The base material may be made of a resin. Also, it may be possible to increase the refractive index by mixing the base material with an inorganic material having a high refractive index, such as $TiO_2$. However, if a protrusion is formed due to aggregation of particles, short-circuiting is likely to occur, and therefore it is preferable that processing that will not decrease the quality, such as coating processing, be performed. Also, there is no particular limitation on the scattering particles as long as the function of diffusing light is exhibited together with the base material, but it is preferable that the scattering particles should not absorb light. The light diffusion layer 7 may be formed through applying the material for the light diffusion layer 7 to the surface of the substrate 6. The method for applying the material thereto may be spin coating, and a coating method such as slit coating, bar coating, spray coating, or ink-jet coating may be used in accordance with the applications or the size of the substrate. A preferable aspect of the light diffusion layer 7 will be described later.

An organic light-emitting stacked body constituting a light emission structure is formed on the light diffusion layer 7. The organic light-emitting stacked body has a configuration in which an organic EL layer is disposed between the anode and the cathode. In this specification, the organic EL layer is defined as a layer between the anode and the cathode. The organic EL layer has a plurality of light-emitting units 1. The light-emitting units 1 may include the hole transport layer, the light-emitting layer 5, the electron transport layer, and the electron injection layer, in this order starting from the side of the anode. In the organic EL element, the light transmissive electrode 2 may serve as the anode and the light reflective electrode 3 may serve as the cathode.

The anode is an electrode for injecting holes, and is preferably made of an electrode material such as metal, alloy, an electroconductive compound that have a high work function, or a mixture thereof, and in order that a difference in HOMO (Highest Occupied Molecular Orbital) level does not increase excessively, the anode is preferably made of the electrode material having a work function of 4 eV or more and 6 eV or less. Examples of the electrode material for the anode include metal oxides such as ITO, tin oxides, zinc oxides, and IZO, metal compounds such as copper iodide, conductive polymers such as PEDOT and polyaniline, conductive polymers doped with any acceptor, and conductive light transmissive materials such as carbon nanotubes. Hence, the anode may be formed on the surface of the light diffusion layer 7 on the substrate 6 as a thin film by a sputtering method, a vacuum deposition method, a coating method, or the like. Note that the sheet resistance of the anode is preferably several hundred $\Omega/\square$ or less, and particularly preferably $100\Omega/\square$ or less. Hence, the thickness of the anode may be preferably set to 500 nm or less, and preferably set in a range of 10 to 200 nm. As the thickness of the anode is reduced, the transmittance of light is improved, but the sheet resistance increases in inverse proportion to the thickness of the anode, and therefore when the area of the organic EL element is increased, an increase in voltage and uniformity ratio of luminance is made non-uniform (due to non-uniformity in current density distribution due to a decrease in voltage). In order to avoid this trading off, in general, it is effective to form auxiliary wiring (grid) made of metal or the like on a transparent anode. It is desirable that examples thereof are excellent in conductivity, and include Ag, Cu, Au, Al, Rh, Ru, Ni, Mo, Cr, Pd, and alloys thereof such as MoAlMo, AlMo, AgPdCu, or the like may be used. In this case, in order that the metal grid does not function as a light blocking material, it is more preferable that insulation processing to prevent electrical current from flowing into a grid portion. Also, in order to minimize the influence of the diffused light being absorbed by the grid, the grid is preferably made of metal having a high reflectance.

In the case where the anode is made of ITO, it is preferable that the film be formed at 150° C. or more, at which ITO is crystallized, or annealing processing (150° C. or more) be performed after the film is formed at a low temperature. If ITO is crystallized, the conductivity is improved and the above-described trading off condition is mitigated. Also, the structure becomes compact, and it is also expected the effect of inhibiting outgas (water) from being transmitted to the organic EL layer in the case where the light diffusion layer 7 is made of a resin.

Examples of a material for the hole injection layer (positive hole injection layer) include an organic material having hole injection capabilities, metal oxides, so-called acceptor-based organic material and inorganic material, and the hole injection layer may be formed with a p-doped layer. The organic material having the hole injection capabilities is the material having hole transporting properties, a work function of about 5.0 to 6.0 eV, and a strong adherence to the anode, for example. Examples thereof include CuPc and starburst amines. Also, examples of the metal oxides having hole injection capabilities include metal oxides containing molybdenum, rhenium, tungsten, vanadium, zinc, indium, tin, gallium, titanium, or aluminum. Also, the examples thereof may include not only oxides containing only one type of metal but also oxides of a plurality of metals, which contain any of metals, such as indium and tin, indium and zinc, aluminum and gallium, gallium and zinc, and titanium and niobium. Also, the hole injection layer made of these materials may be formed by a dry process such as a deposition method or a transfer method, or may be formed by a wet process such as a spin coating method, a spray coating method, a dye coating method, or a gravure printing method.

Materials for the hole transport layer (positive hole transport layer) may be selected from the group of compounds having hole transporting properties, for example. Examples of these types of compound include arylamine-based compounds, amine compounds containing a carbazole group, and amine compounds containing a fluorene derivative, such as 4,4'-bis[N-(naphthyl)-N-phenyl-amino]biphenyl($\alpha$-NPD), N,N'-bis(3-methylphenyl)-(1,1'-biphenyl)-4,4'-diamine (TPD), 2-TNATA, 4,4',4'-tris(N-(3-methylphenyl)N-phenylamino)triphenylamine (MTDATA), 4,4'-N,N'-dicarbazole biphenyl (CBP), spiro-NPD, spiro-TPD, spiro-TAD, and TNB, but the hole transport layer may be made of any generally known hole transporting material.

The light-emitting layer 5 may be made of any material that is known as the material for an organic EL element. Examples thereof include anthracene, naphthalene, pyrene, tetracene, coronene, perylene, phthaloperylene, naphthaloperylene, diphenyl butadiene, tetraphenyl butadiene, coumarin, oxadiazole, bisbenzoxazorine, bisstyryl, cyclopentadiene, quinoline metal complex, tris(8-hydroxyquinolinato) aluminum complex, tris(4-methyl-8-quinolinato) aluminum complex, tris(5-phenyl-8-quinolinato) aluminum complex, amino quinoline metal complex, benzoquinoline metal complex, tri-(p-terphenyl-4-yl)amine, 1-aryl-2,5-di(2-thienyl) pyrrole derivatives, pyran, quinacridone, rubrene, distyryl-benzene derivatives, distyrylarylene derivatives, distyrylamine derivatives, and various fluorescent dyes, and the above-described material systems and derivatives thereof, but there are no limitation thereto. Also, it is preferable to appropriately combine light-emitting materials selected from these compounds. Also, not only compounds producing fluorescence, which are typified by the above-described compounds, but also material systems exhibiting light emission from a spin multiplet, that is, a phosphorescent material emitting phosphorescence, and compounds having a part constituted by these in a portion of the molecule may be preferably used. Also, the light-emitting layer 5 made of these materials may be formed by a dry process such as a vapor deposition method or a transfer method, or may be formed by a wet process such as a spin coating, a spray coating method, a dye coating method, or a gravure printing method.

The interlayer 4 may be made of a material that enables the light-emitting units 1 to generate electrical charge. In order to extract light, the material is preferably light transmissive. For example, the interlayer 4 may be a metal thin film. Examples thereof include silver and aluminum. Alternatively, the interlayer 4 may be made of an organic material. Alternatively, the interlayer 4 may be a metal oxide layer. For example, the interlayer 4 may be made of ITO.

A material for the electron transport layer may be selected from the group of compounds having electron transporting properties. Examples of this type of compound include metal complex such as Alqa, and compound with a hetero ring such as phenanthroline derivatives, pyridine derivatives, tetrazine derivatives, oxadiazole derivatives, which is known as an electron transporting material, but are not limited thereto, and the electron transport layer may be made of any generally known electron transporting material.

Metal halides such as metal fluorides (i.e., lithium fluoride and magnesium fluoride), metal chlorides (i.e., sodium chloride and magnesium chloride), oxides, nitrides, carbides, and oxynitrides of various metals (i.e., aluminum, cobalt, zirconium, titanium, vanadium, niobium, chromium, tantalum, tungsten, manganese, molybdenum, ruthenium, iron, nickel, copper, gallium, zinc, and silicon), such as insulating materials (i.e., aluminum oxide, magnesium oxide, iron oxide, aluminum nitride, silicon nitride, silicon carbide, silicon oxynitride, and boron nitride), silicides such as $SiO_2$ and SiO, and carbon compounds may be arbitrarily selected as a material for the electron injection layer. These materials may be formed into a thin film with a vacuum deposition method or a sputtering method.

The cathode is an electrode for injecting electron into the light-emitting layer, and is preferably made of an electrode material made of metal, alloy, or an electroconductive compound that has a low work function, or a mixture thereof, and in order that a difference in LUMO (Lowest Unoccupied Molecular Orbital) level does not increase excessively, the cathode is preferably made of a material having a work function of 1.9 eV or more and 5 eV or less. Examples of the electrode material for the cathode include aluminum, silver, magnesium, and alloys of these metals and other metals, such as magnesium-silver mixture, magnesium-indium mixture, and aluminum-lithium alloy. Also, it is possible to use an electroconductive material made of metal, metal oxides, mixtures of these and other metals, that is, a stacked film constituted by a extremely thin film made of aluminum oxide (hence, a thin film having a thickness of 1 nm or less that enables electrons to flow by tunnel injection) and a thin film made of aluminum.

In the organic EL element, an organic light-emitting stacked body is preferably sealed by a sealing material. The organic EL layer is easily affected by water, and thus in order to avoid contact with the air, the organic EL layer of the substrate 6 is sealed with cap glass in a glove box that is subjected to dew point management (−70° C. or less, for example). A drying agent or the like is inside the sealing, and thereby storage life can be further improved.

The above-described organic EL element includes the three or more light-emitting units 1, and therefore the thickness of the entire organic light-emitting stacked body has a tendency to be thicker than that of the organic EL element having a single unit or a double unit structure. Therefore, a further effect can be obtained. First, the current density can be reduced, and a sheet resistance value required to perform driving can be reduced. In other words, even if the sheet resistance value relatively increases, driving is possible. Therefore, element design can be simplified and the light extraction efficiency can be increased. Specifically, the thickness of the light transmissive electrode can be reduced. Moreover, if the thickness of the light transmissive electrode is reduced, light absorption is reduced, and therefore the light extraction efficiency can be improved. Next, with regard to an increase in the area (an increase in light emission area), similarly, the sheet resistance value required to perform driving can be reduced. Then, more uniform light emission is possible in the plane. Therefore, an element having a larger light emission area can be constructed. Also, if the thickness of the organic light emitting stacked body is increased, resistance to short-circuiting caused by foreign matter can be increased. This is because the distance between electrodes increases due to an increase in the thickness of the layer structure, and therefore formation of a leak path for the electrical current due to foreign matter can be prevented. Therefore, the reliability of the organic EL element can be improved.

[Light Diffusion Layer]

A preferable example of the light diffusion layer 7 will be described below. The organic EL element of FIG. 1 includes the light diffusion layer 7.

The light diffusion layer 7 preferably includes a first transparent material layer 7a and a second transparent material layer 7b in this order starting from the substrate 6 side. Accordingly, an uneven structure 10 can be easily provided in an interface between two layers. The second transparent material layer 7b preferably has a larger refractive index than that of the substrate 6. Accordingly, a difference in refractive index can be reduced, and the light extraction efficiency can be further increased. The uneven structure 10 is preferably formed in the interface between the first transparent material layer 7a and the second transparent material layer 7b. Light is diffused by the uneven structure 10 due to the light diffusion layer 7 that includes a plurality of layers and the uneven structure 10 in the interface of the layers, and therefore the light extraction properties can be further increased.

Also, if the light diffusion layer 7 is configured by two transparent material layers, the second transparent material layer 7b functions as a coating layer to flatten an unevenness derived from the uneven structure 10, and therefore the light-emitting stacked body can be stably formed. Therefore, disconnection failure or short-circuiting malfunctions resulting from unevenness can be suppressed. Also, in the case where the coating layer is provided, even if an uneven structure 10 having a large height (depth) is provided, the light emitting stacked body can be preferably formed. In this manner, the second transparent material layer 7b can preferably function as a flat layer. Also, the two transparent material layers are transparent and light transmissive, and therefore light can be effectively extracted.

The second transparent material layer 7b preferably has a refractive index of 1.75 or more in a visible light wavelength range. Accordingly, a difference in refractive index can be reduced to suppress total reflection loss at wide angles, and more light can be extracted. The refractive index of the substrate 6 is in a range of 1.3 to 1.55, for example. Although there is no particular limitation on the upper limit of the refractive index of the second transparent material layer 7b, the upper limit thereof may be 2.2, or 2.0, for example. Also, a difference in refractive index between the second transparent material layer 7b and the light transmissive electrode 2, which is a layer adjoining the second transparent material layer 7b, is preferably reduced. For example, this refractive index difference may be set to 1.0 or less.

The refractive index of the first transparent material layer 7a in the visible light wavelength range is preferably in a range of 1.3 to 1.5. Accordingly, more light can be extracted. A difference in refractive index between the first transparent material layer 7a and the substrate 6 is preferably small. For example, this refractive index difference may be set to 1.0 or less. The refractive index of the first transparent material layer 7a is preferably smaller than the refractive index of the substrate 6. In this case, the total reflection in the interface between the first transparent material layer 7a and the substrate 6 can be suppressed. Of course, according to the light diffusion layer 7, light can be extracted due to light diffusion, and therefore the first transparent material layer 7a may have a larger refractive index than that of the substrate 6.

The substrate 6 and the first transparent material layer 7a preferably have low refractive indexes (the lower limit is 1, which is the same as the atmosphere), and as the refractive index approaches 1, total reflection in the interface between the substrate 6 and occurrence of the air can be reduced. Therefore, even if the light extraction structure is not provided on the outside of the substrate 6, light can be extracted, and therefore the structure can be simplified. The light transmittance of the first transparent material layer 7a is preferably high. For example, the first transparent material layer 7a transmits 80% or more of the visible light, and preferably 90% or more thereof.

In the light diffusion layer 7, the first transparent material layer 7a may be a low refractive index layer and the second transparent material layer 7b may be a high refractive index layer, for example. The high refractive index and the low refractive index of the transparent material layers may be relative to each other.

The light diffusion layer 7 (the first transparent material layer 7a and the second transparent material layer 7b) are preferably made of a resin. Accordingly, the refractive index can be easily adjusted and the formation and flattening of unevenness can be easily performed. In the case where the light diffusion layer is made of a resin, the light diffusion layer having a relatively high refractive index can be easily obtained. Also, the resin may be applied to form a layer, and therefore a layer having a flat surface obtained by letting the resin flow into recessed portions can be easily formed.

Examples of the material for the first transparent material layer 7a include acrylic organic resins and epoxy-based organic resins. Also, an additive agent (curing agent, curing accelerator, curing initiator, or the like) for curing the resin may be added to the resin. The material for the first transparent material layer 7a preferably has a small extinction coefficient k, and ideally, k=0 (or a numerical value at an unmeasurable level) is preferable. Therefore, the first transparent material layer 7a preferably has an extinction coefficient k, which equals to 0 in the entire visible wavelength range, but the permissible range of the extinction coefficient k may be determined depending on the thickness of the material. Note that an example of the material other than resin include an inorganic-based material. For example, the first transparent material layer 7a may be made of spin-on-glass.

Examples of the material for the second transparent material layer 7b include resins in which nano-particles having a high refractive index are dispersed, such as $TiO_2$. The resin may be an acrylic organic resin or an epoxy-based organic resin. Also, an additive agent (curing agent, curing accelerator, curing initiator, or the like) for curing the resin may be added to the resin. Also, the material for the second transparent material layer 7b may preferably have a small extinction coefficient k, and ideally, k=0 (or a numerical value at an unmeasurable level) is preferable. Note that examples of the material other than the resin includes an inorganic film made of SiN, a film of inorganic oxide ($SiO_2$ or the like).

The surface of the light diffusion layer 7 formed by coating with the second transparent material layer 7b (the surface on the light transmissive electrode 2 side) is preferably a flat surface. Accordingly, short-circuiting malfunctions and stacking failure are suppressed, and the light-emitting stacked body can be stably formed.

Note that if light emission performance or the like is not affected by eliminating the second transparent material layer 7b, the second transparent material layer 7b may be eliminated. In the case where the second transparent material layer 7b is not provided, the number of layers can be reduced, and therefore the element can be easily manufactured. For example, if the height of the uneven shaped part of the first transparent material layer 7a does not affect the film formation of an upper layer, the second transparent material layer 7b can be eliminated. Even in the case where the second transparent material layer 7b is not provided, the light extraction properties can be increased by the light diffusion layer 7 including the uneven structure 10. However, in order to suppress short-circuiting malfunctions and disconnection failure, it is preferable to form the second transparent material layer 7b as described above.

The first transparent material layer 7a and the second transparent material layer 7b may be formed on the surface of the substrate 6 through applying the material thereto. A suitable coating method may be adopted as the method for applying the material, and spin coating may be used, or a method such as slit coating, bar coating, spray coating, or an ink-jet method may be adopted in accordance with the application or the size of the substrate.

The uneven structure 10 between the first transparent material layer 7a and the second transparent material layer 7b may be formed by an appropriate method. For example, it is possible to mix particles like beads into a transparent material and form the unevenness by the shape of the particles. Also, the unevenness of the uneven structure 10 may be preferably formed by an imprinting method. According to the imprinting method, minute unevenness can be efficiently formed with high precision. Also, as described later, in the case where the unevenness is formed by respectively allocating a protruding portion or a recessed portion to an uneven section, if the imprinting method is used, highly precisely minute unevenness can be formed. In the case where the unevenness is formed by the imprinting method, one uneven section may be configured by one dot where printing is performed. A imprinting method by which a minute structure can be formed is preferable, and a method called nanoimprinting may be used, for example.

The imprinting method is broadly classified into a UV imprinting method and a heat imprinting method, and either of them may be used. For example, the UV imprinting method may be used. The unevenness can be printed (transferred) easily by the UV imprinting method to form the uneven structure 10. A film mold that is molded from a Ni master mold in which a pattern with a rectangular (pillar) structure having a period of 2 μm and a height of 1 μm is formed is used in the UV imprinting method. A UV-curable transparent resin for imprinting is applied to a substrate, and the mold is pressed against the resin surface of this substrate. Thereafter, the resin is irradiated with UV light (i ray having a wavelength λ of 365 nm or the like, for example) through the substrate on the substrate side, or through the film mold on the mold side to cure the resin. In addition, after the resin is cured, the mold is removed therefrom. At this time, a mold release treatment (fluorine-based coating agent or the like) is preferably performed on the mold in advance, and accordingly, the mold can be easily removed from the substrate. Accordingly, the uneven shape of the mold can be transferred to the substrate. Note that this mold is provided with the unevenness corresponding to the shape of the uneven structure 10. Therefore, when the unevenness of the mold is transferred, a desired uneven shape is formed on the layer made of the transparent material. For example, if a mold formed by irregularly allocating recessed portions to sections is used as the mold, an uneven structure 10 in which protruding portions are irregularly allocated can be obtained.

Figure 9A:
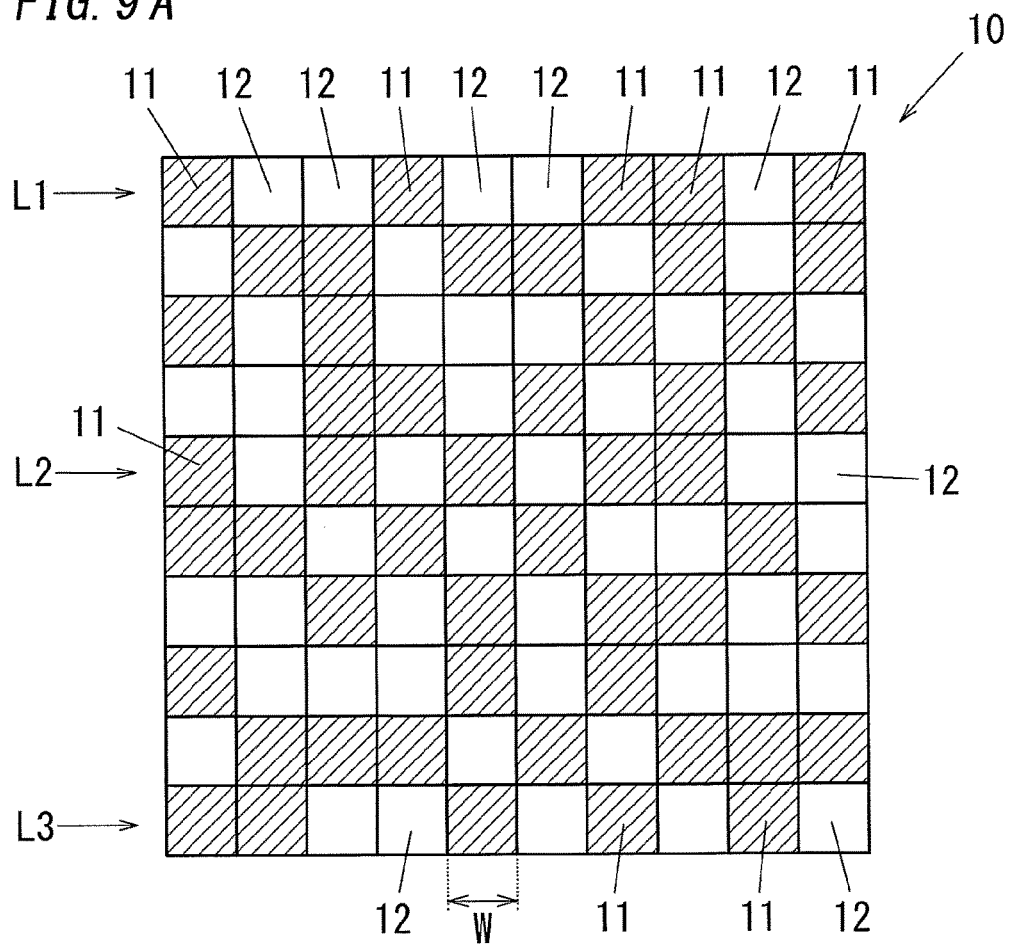
FIG. 9A and FIG. 9B show diagrams illustrating an example of an uneven structure.
Figure 9B:
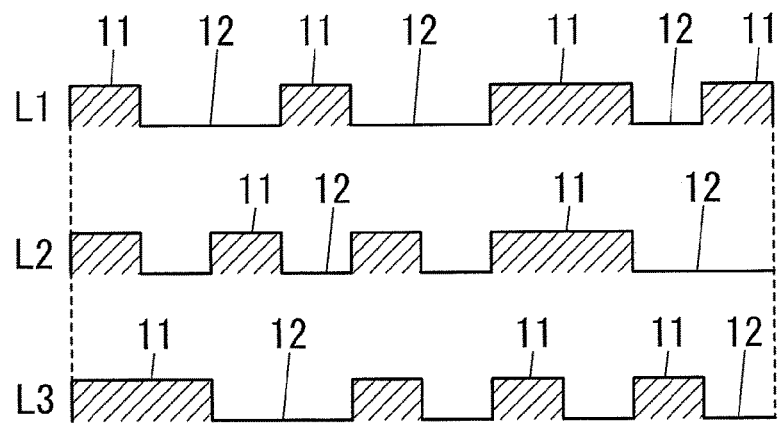

FIG. 9A and FIG. 9B are an example of the uneven structure 10 of the light diffusion layer 7. The uneven structure 10 of the light diffusion layer 7 is preferably a structure in which a plurality of protruding portions 11 or a plurality of recessed portions 12 are disposed in the plane. Accordingly, the light diffusion effect can be increased without angle dependence, and more light can be extracted to the outside. The surface on which the plurality of protruding portions 11 and the plurality of recessed portions 12 are disposed may be a surface parallel to the surface of the substrate 6. FIG. 9A shows the appearance in which the plurality of protruding portions 11 are disposed in the plane. Also, it can be said that FIG. 9A shows the appearance in which the plurality of recessed portions 12 are disposed in the plane. The uneven structure 10 may be a structure in which the plurality of protruding portions 11 and the plurality of recessed portions 12 are disposed in the plane. Note that FIG. 9A shows the uneven structure 10 with the pattern, and the boundaries of sections are drawn with solid line. Actually, the boundaries of the continuous protruding portions 11 and the boundaries of the continuous recessed portions 12 are not needed.

In the uneven structure 10 of the light diffusion layer 7, as shown in FIG. 9A and FIG. 9B, the plurality of protruding portions 11 or the plurality of recessed portions 12 are preferably disposed such that one protruding portion 11 or one recessed portion 12 is randomly allocated to one of the grid sections. Accordingly, the light diffusion effect can be increased without angle dependence, and more light can be extracted to the outside. An example of the grid section is such that one section has a quadrangular shape. The quadrangular shape is more preferably a square shape. In this case, the grid section is a matrix-like grid (square grid) in which a plurality of squares are arranged vertically and horizontally. Another example of the grid section is such that one section has a hexagonal shape. The hexagonal shape is preferably a regular hexagonal shape. In this case, the grid section is a honeycomb-like grid (hexagonal grid) in which a plurality of hexagons are arranged in a packing structure. Note that a triangle grid in which triangles are arranged may be used as the grid, but it is easier to adjust the unevenness of the rectangular grid or the hexagonal grid.

The uneven structure 10 of FIG. 9A and FIG. 9B is formed by allocating the plurality of protruding portions 11 that are substantially equal in height to the sections (grid sections) as the matrix-like unevenness one by one and disposing the allocated protruding portions 11 in the plane. Then, the uneven structure 10 is formed such that the area percentages of the protruding portions 11 per unit region in plan view are substantially equal in the regions. Such an uneven structure 10 can improve the light extraction properties efficiently.

FIG. 9A shows the appearance of the uneven structure 10 viewed in the direction perpendicular to the surface of the substrate 6, and FIG. 9B shows the appearance thereof viewed in the direction parallel to the surface of the substrate 6. In FIG. 9A, sections of protruding portions 11 are indicated by hatched lines. Lines L1, L2, and L3 of FIG. 9A respectively correspond to lines L1, L2, and L3 of FIG. 9B.

As shown in FIG. 9A, this uneven structure 10 is formed by allocating the protruding portions 11 to uneven sections in the form of a matrix in which a plurality of squares are aligned vertically and horizontally (row and column type). The uneven sections are formed to be equal in area. One protruding portion 11 or one recessed portion 12 is allocated to one section of the unevenness (one uneven section). The protruding portions 11 may be allocated regularly, or may be allocated irregularly. In the mode of FIG. 9A and FIG. 9B, the protruding portions 11 are allocated randomly. As shown in FIG. 9B, in the section to which the protruding portion 11 is allocated, the material of the uneven structure 10 protrudes toward the light transmissive electrode 2 to form the protruding portion 11. Also, the plurality of protruding portions 11 are substantially equal in height. Hence, the protruding portions 11 being substantially equal in height may mean that in the case where the heights of the protruding portions 11 are averaged, the heights of the protruding portions 11 are within a range of ±10% of the average height, or preferably within a range of ±5%.

Although the cross-sectional shape of the protruding portion 11 is rectangular in FIG. 9B, it may be an appropriate shape such as a corrugated, inverted triangular, or trapezoidal shape. In a portion where one protruding portion 11 and another protruding portion 11 adjoin each other, the protruding portions 11 connect to each other to form a large protruding portion. Also, in a portion where one recessed portion 12 and another recessed portion 12 adjoin each other, the recessed portions 12 connects to each other to form a large recessed portion. Although there is no particular limitation on the number of connected protruding portions 11 and recessed portions 12, if the number thereof increases, there is a risk that the minute uneven structure 10 will not be formed, and therefore, the number thereof may be appropriately set to 100 or less, 20 or less, 10 or less, or the like, for example. A design rule may be provided such that in the case where there are three or more successive recessed portions 12 or protruding portions 11, or two or more successive recessed portions 12 or protruding portions 11, the next region includes the inverse portions (in the case of recessed portions, the next region includes a protruding portion, whereas in the case of protruding portions, the next region includes a recessed portion). The light diffusion effect is increased and the efficiency and the color difference can be expected to be improved due to this rule.

The uneven structure 10 is formed such that the area percentages of the protruding portions 11 per unit region are substantially equal in the regions. For example, FIG. 9A shows 100 uneven sections in total composed of 10 vertical sections by 10 horizontal sections, and such a region having 100 sections may be set to be a unit region. Then, in this case, the percentages of the areas of protruding portions 11 are substantially equal in each unit region in the plane of the uneven structure 10. In other words, as shown in FIG. 9A, assuming that 50 protruding portions 11 are provided per unit region, about 50 protruding portions 11 (45 to 55 or 48 to 52 protruding portions, for example) may be provided also in another region having the same number of sections for unevenness and the same area. The unit region is not limited to being 100 sections, and may be set to be an appropriate number of sections. For example, the unit region may include 1000 sections, 10000 sections, 100000 sections or more. There are some cases in which the area percentage of the protruding portions 11 differs slightly in accordance with the set region, but a configuration is used in which the area percentages are substantially equal in this example. For example, a difference between each of the upper and lower limits of the area ratio and an average of the area ratio is preferably equal to or less than 10% of the average, more preferably equal to or less than 5% of the average, even more preferably equal to or less than 3% of the average, and still more preferably equal to or less than 1% of the average. The light extraction properties in the plane can be uniformly increased due to the area percentages being equal to each other. Although there is no particular limitation on the area percentage of the protruding portions 11 per unit region, the area percentage thereof may be set in a range of 20 to 80%, preferably in a range of 30 to 70%, and more preferably in a range of 40 to 60%, for example.

In a preferable aspect, the protruding portions 11 and the recessed portions 12 are allocated randomly and disposed in the unit regions. Accordingly, more light having various colors can be extracted without angle dependence. Accordingly, the organic EL element has a structure that is particularly suitable for an organic EL element for lighting.

The uneven structure 10 preferably has minute unevenness. Accordingly, the efficiency can be increased. For example, the minute uneven structure can be formed by using a square having a side of 0.1 to 100 µm as one section for unevenness. One side of the square that forms one section for unevenness may be 0.4 to 10 µm, and if this side is set to 1 µm, the minute uneven structure 10 can be precisely formed. Also, a 1 mm×1 mm square region or a 10 mm×10 mm square region may be used as the unit region. Note that in the uneven structure 10, a material constituting the uneven structure 10 may not be provided in the recessed portions 12. In this case, the entire surface of a lower layer (first transparent material layer 7a) of the uneven structure 10 may serve as a layer in which multiple minute protruding portions 11 are dispersed in the form of islands. For example, in a portion of the recessed portions 12, the second transparent material layer 7b may be in direct contact with the substrate 6.

Although there is no particular limitation on the height of the protruding portion 11, the height thereof may be in a range of 0.1 to 100 µm, for example. Accordingly, the uneven structure 10 having improved light extraction properties can be obtained. For example, if the height of the protruding portion 11 is set in a range of 1 to 10 µm, minute unevenness can be precisely formed.

The plurality of protruding portions 11 in the uneven structure 10 may have the same shape. In FIG. 9A, one protruding portion 11 is provided fully in one section for unevenness, and a protruding portion 11 having rectangular or square shape in plan view is shown, but the shape of the protruding portion 11 in plan view is not limited thereto and may be another shape. For example, the shape thereof may be circular, or polygonal (triangular, pentagonal, hexagonal, octagonal, or the like). In this case, the three-dimensional shape of the protruding portion 11 may be an appropriate shape such as cylindrical, prismatic (triangular pyramidal, quadrangular prismatic, or the like), or pyramidal (triangular pyramidal, quadrangular pyramidal, or the like) shape.

In a preferable aspect, the uneven structure 10 is formed as a diffractive optical structure. In this case, the protruding portions 11 are more preferably provided with a certain regularity so as to have a diffraction structure. With the diffractive optical structure, the protruding portions 11 are preferably formed with periodicity. In the case where the light diffusion layer 7 has the diffractive optical structure, the light extraction properties can be improved. Also, even in the case where the light diffusion layer 7 has a diffraction structure, if a light extraction layer (optical film) is formed on one surface of the substrate 6 on the side opposite to the light diffusion layer 7, light scattering can occur, and therefore the influence of viewing angle dependence can be reduced. In the diffractive optical structure, it is preferable that a period P of the two-dimensional uneven structure 10 (in the case where the uneven structure does not have periodicity, the average period of the uneven structure) be set in a range of approximately ¼ to 100 times the wavelength $\lambda$ where the wavelength in the medium is $\lambda$ (a value obtained by dividing the wavelength in vacuo by the refractive index of the medium). This range may be set in the case where the wavelength of light emitting from the light-emitting layer is in a range of 300 to 800 nm. In this case, the light extraction efficiency is increased due to the geometric-optical effect, or in other words, due to an increase in the area of the surface having an incidence angle of less than the total reflection angle, or due to the effect of extracting light having an angle of the total reflection angle or more by diffracted light. Also, in the case where a particularly small period P is set (in a range of $\lambda/4$ to $\lambda$, for example), the effective refractive index near an uneven structure portion decreases gradually as the distance from the surface of the substrate increases. Therefore, setting a small period P is equivalent to interposing a thin film layer having a refractive index that is between the refractive index of the medium of the layer forming the uneven structure and the refractive index of the coating layer or the anode between the substrate and a layer for coating the unevenness or the anode, and therefore Fresnel reflection can be reduced. In short, if the period P is set in a range of $\lambda/4$ to $100\lambda$, the reflection (total reflection or Fresnel reflection) can be suppressed, and the light extraction efficiency can be increased. Among these, if the period P is smaller than $\lambda$, there is a risk that only the Fresnel loss inhibition effect will be exhibited and the light extraction effect will decrease. On the other hand, if the period P exceeds $20\lambda$, there is a risk that the height of unevenness will need to be increased (in order to obtain a phase difference) accordingly, and it will not be easy to flatten the light diffusion layer 7 with the coating layer (second transparent material layer 7b). Although a method of making the coating layer extremely thick (10 µm or more, for example) is also conceivable, such a method has many harmful effects, such as a decrease in transmittance, and an increase in material cost or outgas in the case of a resin material, and therefore the method of increasing the thickness also has disadvantages. Therefore, the period P is preferably set to $\lambda$ to $20\lambda$, for example.

The uneven structure 10 may be a boundary diffraction structure. The boundary diffraction structure may be formed through randomly disposing the protruding portions 11. Also, it is also possible to use a structure in which a diffraction structure that is partially formed in a minute region in the plane as the boundary diffraction structure is arranged on one surface. In this case, the structure may be referred to a structure in which a plurality of independent diffraction structures are formed in the plane. With the boundary diffraction structure, light is extracted by means of diffraction due to a minute diffraction structure, and the diffraction effect of the entire surface is inhibited from excessively increasing and the angle dependence of light can be decreased. Therefore, the light extraction effect can be increased while suppressing angle dependence.

In the case where the protruding portions 11 and the recessed portions 12 are arranged randomly as in FIG. 9A and FIG. 9B, if there are many successive protruding portions 11 or recessed portions 12, there is a risk that the light extraction properties cannot be sufficiently increased. In view of this, it is preferable to provide a rule in which a predetermined number or more of the same blocks (either of the protruding portions 11 and the recessed portions 12) do not line up successively. In other words, it is preferable that the protruding portions 11 be disposed such that a predetermined number or more of protruding portions 11 do not line up successively in grid sections in the same direction, and the recessed portions 12 be disposed such that a predetermined number or more of recessed portions 12 do not line up successively in grid sections in the same direction. Accordingly, the light extraction efficiency can be increased. Also, the angle dependence of the luminescent color can be reduced. The predetermined number of protruding portions 11 or recessed portions 12 that do not line up successively is preferably ten or less, more preferably eight or less, even more preferably five or less, and still more preferably four or less.

Regarding protruding portions 11 or recessed portions 12, the axis length of an inscribed ellipse or the diameter of an inscribed circle viewed in a direction perpendicular to the surface of the substrate 6 is preferably in a range of 0.4 to 4 μm. The plurality of protruding portions 11 in this case are regarded as an enlarged protruding portion resulting from the successive protruding portions 11 being connected to each other. Similarly, the plurality of recessed portions 12 in this case are regarded as an enlarged recessed portion resulting from the successive recessed portions 12 being connected to each other. By performing control so as not to make too many successive protruding portions 11 or recessed portions 12, the viewing angle characteristics can be improved and the light extraction properties can be further improved. The inscribed ellipse and inscribed circle may be drawn by a virtual line in plan view viewed in the direction perpendicular to the surface of the substrate 6.

Figure 10A:
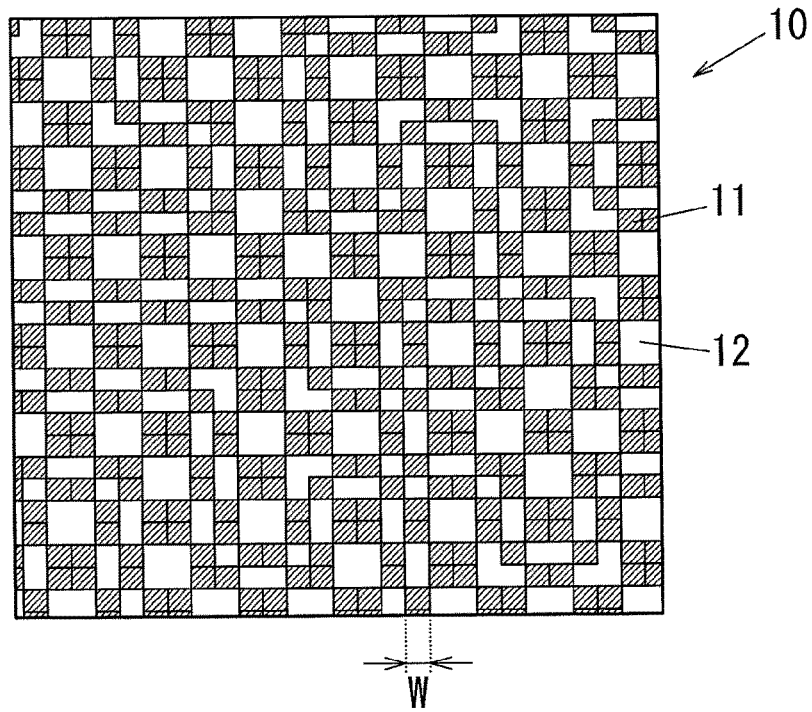
FIG. 10A and FIG. 10B show plan views showing an example of an uneven structure 10.
Figure 10B:
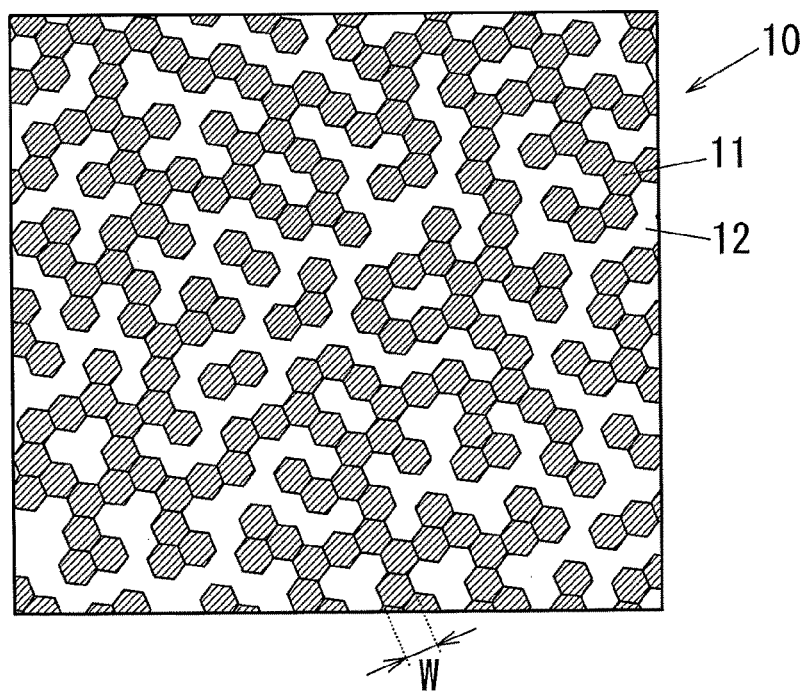

Examples of the uneven structure 10 are shown in FIG. 10A and FIG. 10B. These uneven structures 10 are controlled such that the arrangement is random, and a predetermined number or more of the same blocks (protruding portions 11 or recessed portions 12) do not line up successively in the same direction. Three or more blocks do not line up successively in the same direction in FIG. 10A, and four or more blocks do not line up successively in the same direction in FIG. 10B. The average number of blocks that are lined up may be expressed by average pitch. A block refers to a protruding portion 11 or a recessed portion 12 that is allocated to one section. The average pitch may be expressed by a width w of one block. The uneven structure 10 of FIG. 10A is a square-grid structure and has an average pitch of 3 w. The uneven structure 10 of FIG. 10B is a hexagonal-grid structure and has an average pitch of 3 w. Also, in the case of FIG. 10A and FIG. 10B, with regard to the plurality of protruding portions 11 or recessed portions 12, the axis length of the inscribed ellipse or the diameter of the inscribed circle viewed in the direction perpendicular to the surface of the substrate 6 is preferably in a range of 0.4 to 4 μm.

As shown in FIGS. 9A, 9B, 10A and 10B, the width w refers to the width of one section of the uneven structure 10. In the case of a square grid, the width is the length of one side of the square. In the case of a hexagonal grid, the width w is a distance between two opposing sides. The width w is preferably 0.1 to 100 μm, and more preferably 0.4 to 10 μm.

[Lighting Device]

A lighting device can be obtained with the above-described organic EL element. The lighting device may include the organic EL element, a power source, a switch, and electric wiring that electrically connect these, for example. The lighting device can be configured as a lighting device emitting white light. The lighting device emitting white light is mentioned above, but the luminescent color can be adjusted, and the lighting device can emit light having various color temperatures needed for illumination applications. For example, in the classification of color temperature, colors such as a light bulb color, warm white, white, neutral white, and daylight color can be exhibited. In addition, the above-described organic EL element can provide a lighting device that has high light extraction efficiency and excellent viewing angle characteristics.

Figure 11:
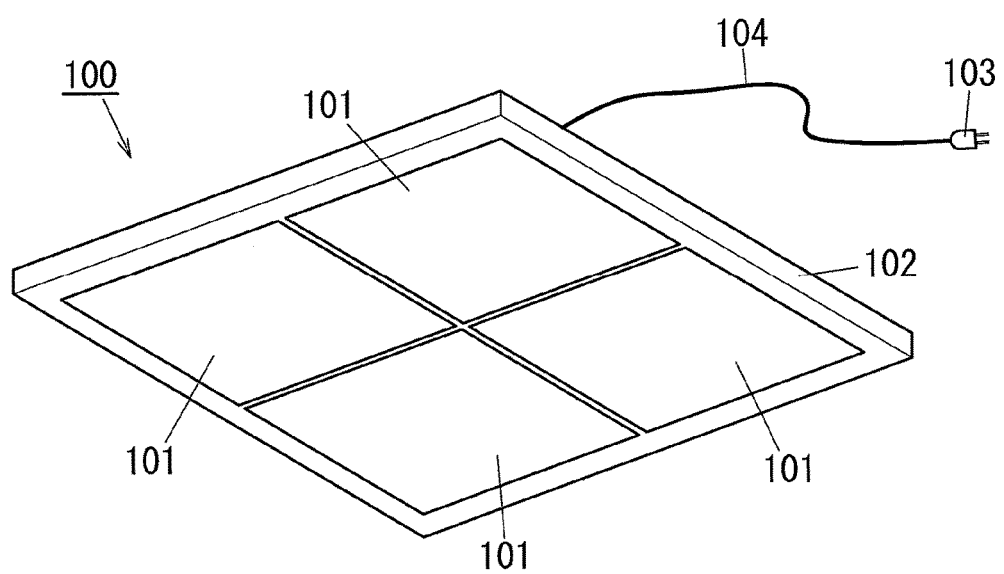
FIG. 11 is a perspective view showing an example of a lighting device.

FIG. 11 is an example of a lighting device 100. This lighting device includes organic EL elements 101, a housing 102, a plug 103, and a wire 104. In FIG. 4, a plurality (four) of organic EL elements 101 are arranged in the plane. The housing 102 accommodates the organic EL elements 101. Electricity is supplied through the plug 103 and the wire 104, and the organic EL elements 101 emit light and the light is emitted from the lighting device 100.

REFERENCE SIGNS LIST

1 Light-emitting unit
1S Short-wavelength light-emitting unit
1L Long-wavelength light-emitting unit
2 Light transmissive electrode
3 Light reflective electrode
5 Light-emitting layer
6 Substrate
7 Light diffusion layer

The invention claimed is:

1. An organic electroluminescent element, comprising a light transmissive electrode, a light reflective electrode, at least three light-emitting units positioned between the light transmissive electrode and the light reflective electrode,
the at least three light-emitting units comprising:
one or more short-wavelength light-emitting units having a weighted average emission wavelength $\lambda_S$, indicated by Equation (1) below, of 380 nm or more and less than 550 nm; and
two or more long-wavelength light-emitting units having a weighted average emission wavelength $\lambda_S$, indicated by Equation (1) below, of 550 nm or more and 780 nm or less, $$\lambda_S = \frac{\int_{380}^{780} P(\lambda) \times \lambda \, d\lambda}{\int_{380}^{780} P(\lambda) \, d\lambda} \tag{1}$$

where $P(\lambda)$ indicates a spectrum intensity at a wavelength,
the two or more long-wavelength light-emitting units being greater in number than the one or more short-wavelength light-emitting units, the two or more long-wavelength light-emitting units each being a phosphorescent unit, the one or more short-wavelength light-emitting units each being a fluorescent unit, each of the at least three light emitting units comprising a light emitting layer, and each of the at least three light emitting units comprising an electrical charge transfer layer provided on a light reflective electrode side of the light emitting layer.

2. The organic electroluminescent element according to claim 1, wherein the at least three light-emitting units include at least one light-emitting unit containing a plurality of light-emitting materials.

3. The organic electroluminescent element according to claim 1, wherein a color temperature of a luminescent color is 2500 K or less.

4. The organic electroluminescent element according to claim 1, wherein the at least three light-emitting units comprise:

one short-wavelength light-emitting unit, as the one or more short-wavelength light-emitting units; and two long-wavelength light-emitting units, as the two or more long-wavelength light-emitting units.

5. The organic electroluminescent element according to claim 1, wherein a distance $d_F$ satisfies conditions of Equation (2) and Equation (3) below, the distance $d_F$ being a distance between a light-emitting layer of a light-emitting unit, located the farthest from the light reflective electrode, of the at least three light-emitting units, and the light reflective electrode, $$D_F(\lambda_S) < \phi(\lambda_S) \times \frac{\lambda_S}{4\pi} + 0.75 \times \lambda_S \quad (2)$$

$$D_F(\lambda_S) = n(\lambda_S) \times d_F \quad (3)$$

wherein, in Equation (2), $\phi(\lambda_S)$ indicates a phase shift that occurs in the light reflective electrode, and in Equation (3), $n(\lambda_S)$ indicates an average refractive index of a medium that is disposed between the light reflective electrode and the light-emitting layer, for a wavelength of $\lambda_S$.

6. The organic electroluminescent element according to claim 1, wherein a light-emitting unit, located the closest to the light reflective electrode, of the at least three light-emitting units is one of the one or more short-wavelength light-emitting units.

7. The organic electroluminescent element according to claim 1, wherein the light transmissive electrode, the at least three light-emitting units, and the light reflective electrode are supported by a substrate, and the organic electroluminescent element further comprises a light diffusion layer that is disposed between the substrate and the light transmissive electrode.

8. The organic electroluminescent element according to claim 1, wherein the at least three light-emitting units include a light-emitting unit containing a green light-emitting material, a light-emitting unit containing a blue light-emitting material, and a light-emitting unit containing a red light-emitting material, which are disposed in this order starting from a side of the light reflective electrode.

9. The organic electroluminescent element according to claim 1, wherein the at least three light-emitting units include a light-emitting unit containing a blue light-emitting material, a light-emitting unit containing a red light-emitting material, and a light-emitting unit containing a green light-emitting material, which are disposed in this order starting from a side of the light reflective electrode.

10. A lighting device comprising the organic electroluminescent element according to claim 1, and a housing accommodating the organic electroluminescent element.

* * * * *